(12) United States Patent
Sandoval et al.

(10) Patent No.: US 7,767,992 B2
(45) Date of Patent: Aug. 3, 2010

(54) MULTI-LAYER CHALCOGENIDE DEVICES

(75) Inventors: Regino Sandoval, Rochester Hills, MI (US); Sergey A. Kostylev, Bloomfield Hills, MI (US); Wolodymyr Czubatyj, Warren, MI (US); Tyler Lowrey, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 251 days.

(21) Appl. No.: 11/451,913

(22) Filed: Jun. 13, 2006

(65) Prior Publication Data
US 2007/0034849 A1 Feb. 15, 2007

Related U.S. Application Data

(63) Continuation-in-part of application No. 11/301,211, filed on Dec. 12, 2005, now Pat. No. 7,525,117, and a continuation-in-part of application No. 11/200,466, filed on Aug. 9, 2005, now abandoned.

(51) Int. Cl.
*H01L 29/02* (2006.01)
(52) U.S. Cl. .............. 257/2; 257/3; 438/102; 438/103; 365/163
(58) Field of Classification Search ........... 257/1–5, 257/E29.002; 438/800, 900, 102–103; 365/163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 5,166,758 A | 11/1992 | Ovshinsky | |
| 5,296,716 A | 3/1994 | Ovshinsky | |
| 5,536,947 A | 7/1996 | Klersy | |
| 5,543,737 A | 8/1996 | Ovshinsky | |
| 5,596,522 A | 1/1997 | Ovshinsky | |
| 5,687,112 A | 11/1997 | Ovshinsky | |
| 5,694,146 A | 12/1997 | Ovshinsky | |
| 5,757,446 A | 5/1998 | Ovshinsky | |
| 5,825,046 A | 10/1998 | Czubatyj | |
| 5,912,839 A | 6/1999 | Ovshinsky | |
| 5,920,788 A * | 7/1999 | Reinberg | 438/466 |
| 6,087,674 A | 7/2000 | Ovshinsky | |
| 6,314,014 B1 | 11/2001 | Lowrey | |
| 6,671,710 B2 | 12/2003 | Ovshinsky | |
| 6,687,153 B2 | 2/2004 | Lowrey | |
| 6,714,954 B2 | 3/2004 | Ovshinsky | |
| 6,774,387 B2 | 8/2004 | Maimon | |
| 6,859,390 B2 | 2/2005 | Pashmakov | |
| 2003/0071289 A1* | 4/2003 | Hudgens et al. | 257/246 |
| 2004/0012008 A1* | 1/2004 | Chen | 257/2 |
| 2004/0043245 A1* | 3/2004 | Moore et al. | 428/644 |

* cited by examiner

*Primary Examiner*—Bradley K Smith
*Assistant Examiner*—Jami M Valentine
(74) *Attorney, Agent, or Firm*—Kevin L. Bray

(57) ABSTRACT

A multi-layer chalcogenide electronic device. The device includes an active region in electrical communication with two terminals, where the active region includes two or more layers. In one embodiment, the pore region includes two or more chalcogenide materials which differ in chemical composition. In another embodiment, the pore region includes one or more chalcogenide materials and a layer of Sb. The devices offer the advantages of minimal conditioning requirements, fast set speeds, high reset resistances and low set resistances.

11 Claims, 16 Drawing Sheets

Energy or Current

FIG − 8

MULTI-LAYER CHALCOGENIDE DEVICES

CROSS-REFERENCE TO RELATED APPLICATIONS

This application is a continuation in part of U.S. patent application Ser. No. 11/301,211, entitled "Chalcogenide Devices and Materials Having Reduced Germanium or Tellerium Content" and filed on Dec. 12, 2005 now U.S. Pat. No. 7,525,117 and a continuation in part of U.S. patent application Ser. No. 11/200,466, entitled "Chalcogenide Devices Incorporating Chalcogenide Materials Having Reduced Germanium or Tellerium Content" and filed on Aug. 9, 2005 now abandoned; the disclosures of which are hereby incorporated by reference herein.

FIELD OF INVENTION

This invention pertains to chalcogenide devices materials having applications as electrical and optical memories and switches. More particularly, this invention relates to chalcogenide devices having an improved interface between the chalcogenide material and an electrical contact. Most particularly, this invention is concerned with a multi-layer material structure that provides chalcogenide devices having better conditioning characteristics, high reset resistance, reduced programming current, low set resistance, and/or high set speeds.

BACKGROUND OF THE INVENTION

Chalcogenide materials are an emerging class of commercial electronic materials that exhibit switching, memory, logic, and processing functionality. The basic principles of chalcogenide materials were developed by S. R. Ovshinsky in the 1960's and much effort by him and others around the world since then have led to advancements of the underlying science and an expansion of the field of application of chalcogenide materials.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds for over $10^{13}$ cycles. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

Another important application of chalcogenide materials is in electrical and optical memory devices. One type of chalcogenide memory device utilizes the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state or phase as well as an amorphous state or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. The set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Each memory state of a chalcogenide memory material corresponds to a distinct resistance value and each memory resistance value signifies unique informational content. Operationally, the chalcogenide material can be programmed into a particular memory state by providing an electric current pulse of appropriate amplitude and duration to transform the chalcogenide material into the structural state having the desired resistance. By controlling the amount of energy provided to a chalcogenide material, it is possible to control the relative proportions of crystalline and amorphous phase regions within a volume of the material and to thereby control the structural (and memory) state of the chalcogenide material to store information.

Each memory state can be programmed by providing the current pulse characteristic of the state and each state can be identified or read in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein as well as in several journal articles including "Low Field Amorphous State Resistance and Threshold Voltage Drift in Chalcogenide Materials", published in IEEE Transactions on Electron Devices, vol. 51, p. 714-719 (2004) by Pirovana et al.; and "Morphing Memory" published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of the chalcogenide materials. The references also describe the structural transformations from the crystalline state to the amorphous state (and vice versa) via a series of partially crystalline states in which the relative proportions of crystalline and amorphous regions vary during the operation of electrical and optical chalcogenide materials.

Current commercial development of the chalcogenide materials and devices is also oriented toward the fabrication of arrays of devices. Chalcogenide materials offer the promise of high density memory, logic and neural arrays that can operate according to traditional binary data storage or according to a multilevel scheme. Chalcogenide arrays further offer the prospect of integrating, on a single chip, both memory and data processing capabilities, thereby enabling high speed operation.

In order to further expand the commercial prospects of chalcogenide phase change memories and switches, it is necessary to consider improvements in the chemical and physical properties of chalcogenide materials as well as refinements in the manufacturing processes. In most currently envisioned near-term memory applications, chalcogenide materials are operated in a binary mode where the memory states correspond to, or approximately correspond to, the set state and the reset state since these states provide the greatest contrast in resistance and thus facilitate discrimination of the state of the material during read out. An outstanding problem that has been identified in the prior art concerns the variability of the set and/or reset resistance of chalcogenide memory devices in the first several cycles of operation of the as-fabricated device. In the typical fabrication process for chalcogenide memory devices, the chalcogenide material is deposited on a lower electrical contact in a kinetically-inhibited or otherwise structurally disordered state and an upper electrical contact is subsequently deposited on the chalcogenide material. The resistance of the device following fabrication, and before the application of an electrical current pulse, may be referred to as the virgin resistance ($R_{virgin}$) of the device. Subsequent application of an electrical current pulse causes the material to achieve an initial set state having an initial set state resistance ($R_{Set,0}$). The initial set state can reset to a first reset state by applying a higher amplitude electrical current pulse. The first reset state can be set by applying a set current pulse to produce another set state having a set state resistance $R_{Set,1}$ and the process can be repeated over multiple set-reset cycles. For each set state achieved upon cycling, a resistance $R_{Set,n}$ can be measured where $R_{Set,n}$ corresponds to the resistance of the set state that is obtained after the device has been reset n times.

When the values of $R_{Virgin}$ and $R_{Set,n}$ are compared for different cycles (represented by different values of n), significant differences are commonly observed in the values of the virgin resistance and set resistance over the first several cycles. The most significant change normally occurs between $R_{Virgin}$ and $R_{Set,0}$, with the deviations decreasing from $R_{Set,0}$ to $R_{Set,1}$ to $R_{Set,2}$ etc. until the value of the set resistance stabilizes. A similar variability may also occur for the resistance of the reset state. For practical memory applications, variability in either the set resistance or reset resistance is undesirable because those resistances are commonly used as indicators for the memory states. Variability in the set resistance or reset resistance frustrates the objective of reliably and reproducibly establishing and detecting the memory states.

In order to eliminate the problem of variability in the prior art devices, it is necessary to undergo a formation process prior to utilization of chalcogenide memory devices in practical applications. The formation process involves post-fabrication electrical conditioning of the device and entails subjecting the device to a sufficient number of set-reset cycles to stabilize the resistances of the set state and/or reset state of the device so that the device is ready for its intended end use. An analogous need for formation or conditioning arises in the chalcogenide switching materials, where variability in the threshold voltage is commonly observed over the course of the first several switching events until a stable threshold voltage is attained. Because of the time and expense associated with the formation process, it is desirable to either simplify it (e.g. by reducing the number of cycling events required to achieve stable device performance) or eliminate it altogether.

In general terms, there are two general factors that potentially contribute to the variability in the resistances and threshold voltages of chalcogenide memory and switching devices. First, the chemical composition and/or physical characteristics of the chalcogenide material may influence the structural state of the chalcogenide upon deposition and the extent to which it varies upon cycling through the set and reset states. Stable set resistances, reset resistances and threshold voltages may require stable and consistent structural configurations of the chalcogenide over multiple cycles of setting, resetting and/or switching. The extent to which the structure varies over multiple cycles may depend on the composition of the chalcogenide. The composition may influence the crystal structure of the crystalline phase that forms upon setting, the relative proportions of crystalline and amorphous phase regions present at a particular resistance value, the spatial arrangement of crystalline and amorphous phase regions, and the kinetic and thermodynamic energy barriers associated with structural rearrangements and changes in phase. Some or all of these factors may contribute to the consistency of the set resistance, reset resistance and/or threshold voltage of a chalcogenide device. Amelioration of the variability of the set and reset resistances of chalcogenide devices through modifications of the chemical composition has been described in the co-pending parent applications, Ser. No. 11/200,466 ('466 application, filed Aug. 9, 2005) and Ser. No. 11/301,211 ('211 application, filed Dec. 12, 2005), the disclosures of which are incorporated by reference herein. More specifically, the '466 and '211 applications disclose a family of chalcogenide materials comprising Ge, Sb, and Te that contain a relatively low concentration of Ge and/or Te relative to standard prior art chalcogenide alloys such as $Ge_2Sb_2Te_5$. The new materials were shown to reduce variability in the set resistance upon initial cycling from the virgin state and to require fewer cycles to complete formation.

A second factor that may contribute to variability in the resistances and/or threshold voltages of chalcogenide materials is the quality of the interface between the chalcogenide material and either or both of the upper and lower electrical contacts in a chalcogenide device. Since the measured resistance of a chalcogenide device includes the resistance of the interfacial region of the contacts, variability in the characteristics of the interface may lead to variability in the resistance values. Since this is an area that has not been adequately addressed in the prior art, there is a need to understand the factors that determine the quality of the interface and their effect on the reproducibility and consistency of the set resistance, reset resistance and/or threshold voltage of chalcogenide devices, especially upon initial cycling of an as-processed device.

SUMMARY OF THE INVENTION

The instant invention provides chalcogenide memory and switching devices that include an active region extending between two electrical terminals, where the active region includes two or more layers and at least one of the layers is a chalcogenide material. By combining a chalcogenide layer with one or more other layers in the active region, the instant devices combine desirable features provided by different compositions to achieve chalcogenide memory and switching devices having superior operational characteristics.

In one embodiment, the active region of the device includes a first layer that promotes a fast set speed and a second layer that enables a high reset resistance. In another embodiment, the active region of the device includes a first layer that facilitates the conditioning of the device by providing a reduction in the number of formation cycles required to prepare the device for its intended application and a second layer that enables a high reset resistance.

In one embodiment, the active region includes two chalcogenide layers having different chemical compositions where one layer has been designed to provide a high quality and/or low resistance interface with an electrical terminal or electrode of the device. In this embodiment, the chalcogenide interface layer is in physical contact with a terminal and acts to reduce the virgin resistance and/or the number of conditioning or formation cycles needed to prepare the device for its intended application. In one embodiment, the improved interface is achieved by inhibiting the formation of resistive oxides at the chalcogenide-terminal interface. In another embodiment, the chalcogenide material in contact with a terminal of the device is selected on the basis of its high set speed. In another embodiment, a chalcogenide material having a low Ge content is in contact with an electrical terminal of the device. The second chalcogenide material included in the active region may be selected on the basis of a desirable property feature such as a high reset resistance or reduced reset programming current. In a preferred embodiment, the first and second chalcogenide layers promote different desirable performance features of the device.

In another embodiment, the instant multi-layer devices include one chalcogenide layer and a layer of Sb, where the Sb layer is in physical contact with a terminal of the device. In one embodiment, inclusion of the Sb layer facilitates the conditioning process by reducing the number of cycles of formation needed to prepare the device for its intended application. The chalcogenide material included in the pore region may be selected on the basis of a desirable property feature such as a high reset resistance. In a preferred embodiment, the Sb and chalcogenide layers promote different desirable performance features of the device.

In other embodiments of the instant invention, the active region of the device includes three layers—one layer in physical contact with one terminal of the device, a second layer in physical contact with a second terminal of the device, and an intermediate layer disposed between the other two layers. The layers in contact with the terminals are selected to provide a high quality interface with the terminal to facilitate conditioning, inhibit oxidation, promote set speed or enhance some other desirable performance feature. The layers in contact with the terminals may be Sb, Ge, or a chalcogenide material. The intermediate layer is selected to provide a high reset resistance, low reset current or some other desirable performance feature and is preferably a chalcogenide material. In a preferred embodiment, the intermediate layer and layers in contact with the terminals promote different desirable performance features of the device.

The chalcogenide materials suitable for inclusion in one or more of the multi-layer devices of this invention generally include Te. More preferably, the chalcogenide materials further include Sb and/or Ge. The preferred chalcogenide materials in physical contact with a terminal of the device include an atomic concentration of Ge that is less than 22%. In a preferred embodiment, the atomic concentration of Ge is between 11% and 19%. In another preferred embodiment, the atomic concentration of Ge is between 13% and 18%. In another preferred embodiment, the atomic concentration of Sb is greater than or equal to 30%. In another preferred embodiment, the atomic concentration of Sb is greater than or equal to 40%. In another preferred embodiment, the atomic concentration of Te is less than 50%. The preferred chalcogenide materials to be included in the active region in combination with a chalcogenide material in physical contact with a terminal include materials having an atomic concentration of Ge of at least 22%.

DETAILED DESCRIPTION OF THE ILLUSTRATED EMBODIMENTS

Figure 1:
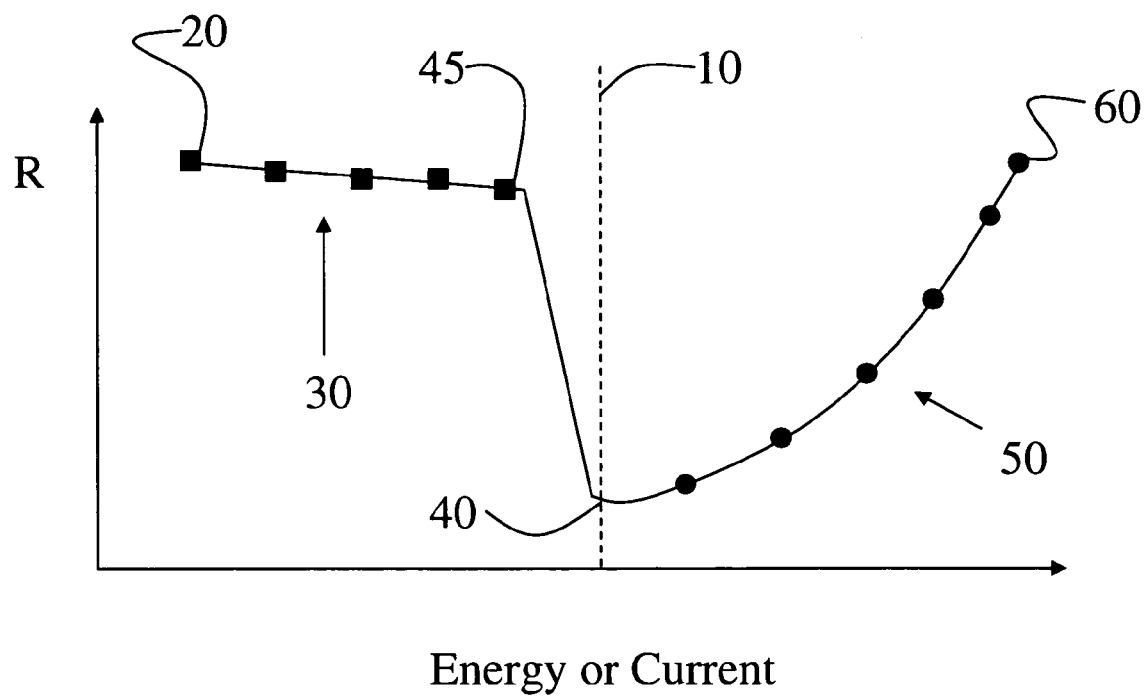
FIG. 1. Schematic depiction of the resistance of a chalcogenide material as a function of energy or current.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

One of the challenges in the field of chalcogenide devices has been the identification of an effective combination of an active chalcogenide material and a surrounding device structure that optimizes device performance. Among the desirable performance characteristics of chalcogenide memory devices are a high reset resistance, low set resistance, fast set speed, long cycle life, low reset current, stable and reproducible operation, and little or no need for formation following fabrication. Ideally, it is desirable to simultaneously achieve all of the preferred operational characteristics with a single chalcogenide material within a convenient device structure. In practice, however, it is found that optimization of some of the desirable operational characteristics occurs at the expense of other desirable operational characteristics. $Ge_2Sb_2Te_5$, for example, is a widely used chalcogenide material. $Ge_2Sb_2Te_5$ offers the advantages of a high reset resistance and low reset current, but suffers from the drawbacks of a high virgin resistance, slow set speed, high set resistance, and relatively demanding formation requirements.

While not wishing to be bound by theory, a factor that is believed to contribute in part to the detrimental operational characteristics of $Ge_2Sb_2Te_5$ is the low quality interface that forms between $Ge_2Sb_2Te_5$ and the contacts of the device structure that provide electrical signals to $Ge_2Sb_2Te_5$. The contacts may also be referred to herein as electrical contacts or electrodes. It has been experimentally determined that it is difficult to form a good contact between $Ge_2Sb_2Te_5$ and many of the higher resistance materials commonly used as contacts. The inability to form a good contact is believed to contribute to the high virgin and set resistances of devices based on $Ge_2Sb_2Te_5$ and to the failure of such devices over prolonged cycling.

Under one theory, the interface of $Ge_2Sb_2Te_5$ with electrical contacts is compromised through the formation of germanium oxide phases. The formation of germanium oxide phases is believed to occur either during device fabrication or during device operation upon repeated set-reset cycles. The characteristics of the germanium oxide phases may evolve over time or upon cycling and this evolution contributes to the need to condition the devices prior to practical operation by end users. Furthermore, like oxides generally, the germanium oxide phases are resistive and have the effect of measurably increasing the set resistance of the device above that dictated by the structural state of the chalcogenide material.

A desire to curtail the deleterious effects of germanium oxide phases motivated the inventions described in the co-pending parent applications, Ser. No. 11/200,466 ('466 application) and Ser. No. 11/301,211 ('211 application), the disclosures of which are incorporated by reference herein. The '466 and '211 applications are directed at chalcogenide materials having a relatively low Ge concentration. It is expected that a reduction of the Ge concentration in the chalcogenide composition will inhibit the formation of germanium oxide phases and improve the performance of chalcogenide devices. As described in the '211 and '466 applications, the low Ge concentration chalcogenide alloys showed low virgin and set resistances and a greatly reduced need for formation. This suggests that an improved interface forms between the low Ge concentration chalcogenide alloys and common electrode materials. The improved interface may be due to an inhibition in the formation of resistive germanium oxide phases and/or formation of a low resistance contact between the low Ge concentration chalcogenide alloys and common electrode materials. The low Ge concentration chalcogenide alloys also showed improved set speeds. A full comparative assessment of the properties of devices that include the low Ge concentration chalcogenide alloys relative to devices that include $Ge_2Sb_2Te_5$ indicates, however, that the low Ge concentration chalcogenide alloys lead to lower reset resistances and higher reset currents.

Based on the results available for the low Ge concentration chalcogenide devices and $Ge_2Sb_2Te_5$ devices, it would be desirable to combine the beneficial features of each in a single device system. The instant invention is directed in part toward this goal. This invention provides chalcogenide devices having an improved interface between the chalcogenide material and one or more electrical contacts of a chalcogenide memory or switching device having two or more terminals, while achieving a high reset resistance and/or low reset current. Among the objectives of the instant invention is the achievement of chalcogenide devices having a low resistance at the interface of the active chalcogenide material and an electrical contact. The resistance at the interface between a chalcogenide material and an electrical contact may be referred to herein as the interface resistance or a contact resistance. The measured resistance of a chalcogenide device includes the resistances of the top and bottom contacts, the interface resistance at the top and bottom contacts and the resistance of the chalcogenide material located between the top and bottom contacts. The chalcogenide material located between the top and bottom contacts, and away from the interface, may be referred to herein as the bulk chalcogenide material.

It is generally desirable for the measured resistance of a chalcogenide device to be controlled primarily by the resistance of the bulk chalcogenide material. This objective is desirable because differences in the resistance of the chalcogenide material that occur upon a change of phase (e.g. changes in the relative proportions of amorphous and crystalline regions within a volume of chalcogenide material) may be used to distinguish and define different memory states. In order for a memory device to be effective, the resistances of the different memory states must be readily distinguishable to permit accurate and unambiguous reading of the information stored in the device.

If the interface resistance at either or both of the top and bottom contacts is high due to the presence of a persistent resistive phase such as a germanium oxide, the ability to reliably distinguish different memory states may be compromised. Consider, for example, a limiting case in which the resistance at an interface is infinite. In such a case, the measured resistance of the device is infinite regardless of the resistance of the bulk chalcogenide material. As a result, the state of the chalcogenide material has no effect on the measured resistance and changes in resistance that accompany changes in the phase of the chalcogenide material become undetectable. In this scenario, the different memory states represented by different structural states of the chalcogenide material become indistinguishable and unresolvable on the basis of a measurement of the device resistance. As the interface resistance decreases, however, the contribution of the bulk chalcogenide material to the measured resistance increases and changes in the resistance of the chalcogenide material that accompany changes in its structural state become a more meaningful contribution to the measured resistance. The ability to detect and resolve the different memory states is accordingly improved. In the limit of no interface resistance, the measured resistance of the device is controlled by the resistance of the bulk chalcogenide material and any change in the resistance of the bulk chalcogenide material becomes more readily detectable. The problem of interface resistance is most pronounced for the set state of the device since the chalcogenide resistance is lowest for the set state, which means that the interface resistance exerts a proportionately greater influence on the measured resistance when the device is in the set state.

Strategies for controlling the interface resistance can in principle involve modifications to the material used for electrical contacts or to the composition of the chalcogenide memory or switching material. Since the materials used for electrical contacts are frequently constrained by process requirements, it is desirable to identify chalcogenide materials that form high quality, low resistance contacts to the best performing, most convenient, and widely used electrical contact materials. This is one strategy that is pursued in the instant invention.

In addition to low interface resistance at either or both of the upper and lower contacts, it is further desirable to have the memory states of a memory device span a wide range of resistance values. In the case of binary memory devices, a wide range of resistance values provides greater resolution of the memory states (typically the set state and reset state) and simplifies discrimination of the two states. In multistate memory devices, a wide range of resistance values provides for a greater number of memory states for a given resolution between states. When achieving the objective of an improved interface resistance, it is therefore preferable to do so while maintaining a large difference in the resistances of the set state and reset state. As described in further detail hereinbelow, embodiments of the instant invention provide chalcogenide devices that exhibit high quality, low resistance interfaces. Embodiments further include chalcogenide devices having a low resistance interface in combination with a high resistance reset state.

Embodiments of the instant invention include chalcogenide devices having an active chalcogenide region that includes two or more layers, where each layer has a different chemical composition. As used herein, the active chalcogenide region refers to the region disposed between two contacts of a chalcogenide memory or switching device. In a typical device configuration, the active chalcogenide region is disposed between an upper contact and a lower contact in a two-terminal device configuration. In one embodiment, the active chalcogenide region includes two chalcogenide layers having distinguishable chemical compositions. In this embodiment, one of the layers is designed to provide a high quality and/or low resistance interface with either the upper or lower contact, while the other layer is designed to have at least one performance characteristic that is superior to the same characteristic of the other layer. In one embodiment, one of the layers is $Ge_2Sb_2Te_5$ or a Ge-rich alloy and the other layer is a Ge-lean chalcogenide alloy such as, for example, those described in the '466 and '211 applications. In another embodiment, one of the layers is $Ge_2Sb_2Te_5$ or a Ge-rich alloy and the other layer is Sb or an Sb-rich alloy.

Other embodiments of the instant invention include an active region that contains three layers (chalcogenide and/or Sb) with an upper layer forming an interface with the upper contact, a lower layer forming an interface with the lower contact and a third layer disposed between the upper and lower chalcogenide layers. In this embodiment, the upper and lower chalcogenide interface layers are designed to provide a high quality and/or low resistance interface with the upper and lower contacts, respectively, while the remaining intermediate layer is designed to possess a performance characteristic that surpasses the same characteristic in one or both of the upper and lower chalcogenide layers. The upper and lower chalcogenide interface layers may have the same or different composition and the intermediate chalcogenide layer has a composition that differs from at least one of the upper and lower chalcogenide interface layers. In one embodiment, the upper and lower chalcogenide interface layers include a Ge-lean or Sb-rich chalcogenide alloy such as those described in the '211 and '466 applications and the intermediate chalcogenide layer is $Ge_2Sb_2Te_5$.

By combining two or more layers having different chalcogenide compositions in the active region of the device, the instant invention achieves improved performance characteristics by benefiting from the desirable characteristics of different compositions in a single-device structure. The beneficial reset resistance of $Ge_2Sb_2Te_5$ and low virgin resistance of a Ge-lean chalcogenide composition, for example, may be achieved in a single device structure. Representative embodiments are described in further detail in the illustrative examples presented hereinbelow.

Before describing the illustrative embodiments, it is helpful to review the basic principles of operation of chalcogenide materials. As described hereinabove, an important feature of the chalcogenide materials during the operation of chalcogenide memory devices and device arrays is their ability to undergo a phase transformation between or among two or more structural states. (The importance of phase transformations in memory applications has prompted some people to refer to chalcogenide materials as phase change materials and they may be referred to herein as such.) The chalcogenide materials have structural states that include a crystalline state, one or more partially-crystalline states and an amorphous state. The crystalline state may be a single crystalline state or a polycrystalline state. As used herein, a partially-crystalline state refers to a structural state of a volume of chalcogenide material that includes an amorphous portion and a crystalline portion. Generally, a plurality of partially-crystalline states exists for the phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the partially-crystalline states have fractional crystallinities that vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states of a chalcogenide material are induced by providing energy to the chalcogenide material. Energy in various forms can influence the fractional crystallinity of a chalcogenide material and induce structural transformations. Suitable forms of energy include electrical energy, thermal energy, optical energy or other forms of energy (e.g. particle-beam energy) that induce electrical, thermal or optical effects in a chalcogenide material. Combinations of different forms of energy may also induce structural transformations. Continuous and reversible variability of the fractional crystallinity is achievable by controlling the energy environment of a chalcogenide material. A crystalline state can be transformed to a partially-crystalline or an amorphous state, a partially-crystalline state can be transformed to a different partially-crystalline state as well as to either a crystalline or amorphous state, and an amorphous state can be transformed to a partially-crystalline or crystalline state through proper control of the energy environment of a chalcogenide material. Some considerations associated with the use of electrical energy to induce structural transformations are presented in the following discussion.

The use of electrical energy to induce structural transformations typically relies on the application of electrical (current or voltage) pulses to a chalcogenide material. By controlling the magnitude and/or duration of electrical pulses applied to a chalcogenide material, it is possible to continuously vary the fractional crystallinity. The influence of electrical energy on the structure of a chalcogenide material is frequently depicted in terms of the variation of the low field electrical resistance of a chalcogenide material with the amount of electrical energy provided or the magnitude of the current or voltage pulse applied to a chalcogenlide material. A representative depiction of the low field electrical resistance (R) of a chalcogenide material as a function of electrical energy or current pulse magnitude (Energy/Current) is presented in FIG. 1 herein. FIG. 1 shows the variation of the low field electrical resistance of a chalcogenide material resulting from electrical energy or current pulses of various magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance at and beyond a threshold energy. The accumulation regime thus extends, in the direction of increasing energy, from the leftmost point 20 of the resistance plot, through a plateau region (generally depicted by 30) corresponding to the range of points over which the resulting resistance variation is small or gradual up to the set point or state 40 that follows an abrupt decrease in electrical resistance. The plateau 30 may be horizontal or sloping. The left side of the resistance plot is referred to as the accumulating regime because the structural state of the chalcogenide material continuously evolves as energy is applied, with the fractional crystallinity of the structural state correlating with the total accumulation of applied energy. The leftmost point 20 corresponds to the structural state in the accumulating regime having the lowest fractional crystallinity. This state may be fully amorphous or may contain some residual crystalline content. As energy is added, the fractional crystallinity increases, and the chalcogenide material transforms in the direction of increasing applied energy among a plurality of partially-crystalline states along the plateau 30. Selected accumulation states (structural states in the accumulation region) are marked with squares in FIG. 1. Upon accumulation of a threshold amount of applied energy, the fractional crystallinity of the chalcogenide material increases sufficiently to effect a setting transformation that is characterized by a dramatic decrease in electrical resistance and stabilization of the set state 40. Structural transformations in the accumulating regime are unidirectional in the sense that they progress in the direction of increasing applied energy within the plateau region 30 and are reversible only by first amorphizing or resetting chalcogenide material. The behavior illustrated in FIG. 1 is reproducible over many cycles of setting and resetting a device containing a chalcogenide material by applying the requisite energy or current. Once the reset state is obtained, lower amplitude current pulses can again be applied and the accumulation response of the chalcogenide material can be retraced. It is thus possible to cycle between the set and reset states over multiple cycles, a necessary feature for high memory cycle life.

While not wishing to be bound by theory, the instant inventors believe that the addition of energy to a chalcogenide material in the accumulating regime leads to an increase in fractional crystallinity through the nucleation of new crystalline domains or growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material between the two device electrodes. This type of crystallization may be referred to as sub-percolation crystallization. The setting transformation coincides with a percolation threshold in which a contiguous, interconnected crystalline network forms within the chalcogenide material between the two device electrodes. Such a network may form, for example, when crystalline domains increase, sufficiently in size to impinge upon neighboring domains. Since the crystalline phase of chalcogenide materials is less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 1 may be referred to as the grayscale regime or grayscale region. The grayscale regime extends from the set state 40 through a plurality of intermediate states (generally depicted by 50) to a reset point or state 60. The various points in the grayscale regime may be referred to as grayscale states of the chalcogenide material. Selected grayscale states are marked with circles in FIG. 1. Structural transformations in the grayscale regime may be induced by applying an electric current or energy pulse to a chalcogenide material, as indicated in FIG. 1. In the grayscale regime, the resistance of the chalcogenide material varies with the magnitude of the applied electric pulse. The resistance of a particular state in the grayscale regime is characteristic of the structural state of the chalcogenide material, and the structural state of a chalcogenide material is dictated by the magnitude of the current pulse applied in the grayscale region. The fractional crystallinity of the chalcogenide material decreases as the magnitude of the current pulse increases. The fractional crystallinity is highest for grayscale states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the grayscale region.

In contrast to the accumulating region, structural transformations that occur in the grayscale region are reversible and bi-directional. For this reason, the grayscale region may also be referred to as the direct overwrite region of the resistance plot. As indicated hereinabove, each state in the grayscale region may be identified by its resistance and a current pulse magnitude, where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the higher resistance reset state along the grayscale resistance curve. Similarly, if the subsequent current pulse has a lower magnitude than the pulse used to establish the initial state, the fractional crystallinity of the chalcogenide material increases and the structural state is transformed from the initial state in the direction of the lower resistance set state along the grayscale resistance curve.

In OUM (Ovonic Unified (or Universal) Memory) applications, the grayscale states of the chalcogenide material are used to define memory states of a memory device. Most commonly, the memory devices are binary memory devices that utilize two of the grayscale states as memory states, where a distinct information value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value as exemplified, for example, by the grayscale states in FIG. 1. The operation of transforming a chalcogenide material to the structural state associated with a particular memory state may be referred to herein as programming the chalcogenide material, writing to the chalcogenide material or storing information in the chalcogenide material.

To facilitate readout and to minimize readout error, as described hereinabove, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 µm in a typical two-terminal device structure, for example, the resistance of the reset state is ~100 kΩ-1000 kΩ and the resistance of the set state is under ~10 kΩ. Phase-change materials in general show resistances in the range of ~100 kΩ to ~1000 kΩ in the reset state and resistance of ~0.5 kΩ to ~50 kΩ in the set state. In the preferred phase-change materials, the resistance of the reset state is at least a factor of two greater than the resistance of the set state. In addition to binary (single bit per device) memory applications, chalcogenide materials may be utilized as non-binary or multiple bit per device memory devices by selecting three or more states from among the grayscale states and associating an information value with each state, where each memory state corresponds to a distinct structural state of the chalcogenide and is characterized by a distinct resistance value.

A wide range of chalcogenide compositions has been investigated in an effort to optimize the performance characteristics of chalcogenide devices. Chalcogenide materials generally include a chalcogen element and one or more chemical or structural modifying elements. The chalcogen element (e.g. Te, Se, S) is selected from column VI of the periodic table and the modifying elements can be selected from column III (e.g. Ga, Al, In), column IV (e.g. Si, Ge, Sn), or column V (e.g. P, As, Sb) of the periodic table. The role of modifying elements includes providing points of branching or crosslinking between chains comprising the chalcogen element. Column IV modifiers can function as tetracoordinate modifiers that include two coordinate positions within a chalcogenide chain and two coordination positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments of the instant devices include ternary, quaternary and higher chalcogenide alloys. Selected specific embodiments of the chalcogenide composition are described in further detail below.

Chalcogenide alloys that include the elements Ge, Sb, and/or Te are among the most promising materials for electrical and optical devices. As indicated hereinabove, the alloy $Ge_2Sb_2Te_5$ is widely used in chalcogenide electrical memory devices. $Ge_2Sb_2Te_5$ is among the alloys located on the $Ge_2Te_3$—$Sb_2Te_3$ timeline of a ternary Ge—Te—Sb phase diagram. Other alloys of the timeline are also widely used and within the scope of the instant invention. In addition, off-timeline alloys such as those described in the '466 and '211 applications are also within the scope of the instant invention.

Embodiments of the instant invention provide electronic devices that include chalcogenide materials for improved electrode interface properties whose composition includes Ge and Sb. In one embodiment, the atomic concentration of Ge is between 11% and 21%. In a preferred embodiment, the atomic concentration of Ge is between 13% and 20%. In another preferred embodiment, the atomic concentration of Ge is between 15% and 18%. In one embodiment, the atomic concentration of Sb is between 22% and 65%. In a preferred embodiment, the atomic concentration of Sb is between 28% and 43%. In another preferred embodiment, the atomic concentration of Sb is between 32% and 35%. In each of the foregoing embodiments, the composition ranges indicated for each of the elements is inclusive of the endpoint compositions.

The instant invention further electronic devices that include chalcogenide materials for improved electrode interface properties having Ge and Sb in the concentration ranges described above as well as Te. In one embodiment, the atomic concentration of Te is between 28% and 55%. In a preferred embodiment, the atomic concentration of Te is between 43% and 55%. In another preferred embodiment, the atomic concentration of Te is between 48% and 51%. In each of the foregoing embodiments, the composition ranges indicated for each of the elements is inclusive of the endpoint compositions.

Other embodiments of the instant chalcogenide devices include materials for improved electrode interface properties having Ge and Sb where the atomic concentration of Ge is less than or equal to 20% and the atomic concentration of Sb is greater than or equal to 30%. In one preferred embodiment, the atomic concentration of Ge is less than or equal to 16% and the atomic concentration of Sb is greater than or equal to 40%. In another preferred embodiment, the atomic concentration of Ge is less than or equal to 12% and the atomic concentration of Sb is greater than or equal to 50%. In other preferred embodiments, the instant devices include chalcogenide material having the foregoing atomic concentrations of Sb and an atomic concentration of Ge between 11% and 19%, more preferably between 13% and 18% and most preferably between 15% and 17%. In still other preferred embodiments, the instant chalcogenide material includes Ge and Sb in the foregoing atomic concentrations and further includes Te. In one embodiment, the atomic concentration of Te is less than or equal to 50% and more preferably between 20% and 50%. In another embodiment, the atomic concentration of Te is less than or equal to 40% and more preferably between 30% and 40%. In another embodiment, the atomic concentration of Te is less than or equal to 30%.

In other embodiments, the devices include a chalcogenide alloy for improved electrode interface properties having a Ge concentration in the range from 11%-22%, an Sb concentration in the range from 22%-65%, and a Te concentration in the range from 28%-55%. In another embodiment, the alloy is a material having a Ge concentration in the range from 13%-20%, an Sb concentration in the range from 28%-43%, and a Te concentration in the range from 43%-55%. In one embodiment, the alloy is a material having a Ge concentration in the range from 15%-18%, an Sb concentration in the range from 32%-35%, and a Te concentration in the range from 48%-51%.

A representative list of chalcogenide materials, intended to be illustrative rather than limiting, suitable for inclusion in the active region for improved electrode interface properties of the instant chalcogenide devices is provided in the three columns below:

| Chalcogenide Material | Chalcogenide Material | Chalcogenide Material |
| --- | --- | --- |
| $Ge_{45.5}Sb_{15.5}Te_{38.9}$ | $Ge_{25}Sb_{40}Te_{35}$ | $Ge_{15.5}Sb_{45.5}Te_{38.9}$ |
| $Ge_{42}Sb_{43}Te_{15}$ | $Ge_{25.0}Sb_{35.5}Te_{39.5}$ | $Ge_{13.5}Sb_{53}Te_{33.5}$ |
| $Ge_{42.0}Sb_{38.5}Te_{19.5}$ | $Ge_{25}Sb_{25}Te_{50}$ | $Ge_{13.3}Sb_{48.8}Te_{37.8}$ |
| $Ge_{37.8}Sb_{17.8}Te_{44.4}$ | $Ge_{22.2}Sb_{22.2}Te_{55.5}$ | $Ge_{11.1}Sb_{61.1}Te_{27.8}$ |
| $Ge_{36.1}Sb_{36.1}Te_{27.8}$ | $Ge_{20}Sb_{65}Te_{15}$ | $Ge_{11.1}Sb_{56.6}Te_{32.3}$ |
| $Ge_{31}Sb_{54}Te_{15}$ | $Ge_{20.0}Sb_{60.5}Te_{19.5}$ | $Ge_{0.09}Sb_{0.69}Te_{0.22}$ |
| $Ge_{31.0}Sb_{49.5}Te_{19.5}$ | $Ge_{20}Sb_{30}Te_{50}$ | $Ge_{8.9}Sb_{64.4}Te_{26.7}$ |
| $Ge_{30.5}Sb_{30.5}Te_{38.9}$ | $Ge_{20.0}Sb_{25.5}Te_{54.5}$ | $Ge_{7}Sb_{77}Te_{17}$ |
| $Ge_{25.2}Sb_{40.7}Te_{35.1}$ | $Ge_{17.8}Sb_{37.8}Te_{44.4}$ | $Ge_{6.7}Sb_{72.2}Te_{21.2}$ |
| $Ge_{25}Sb_{50}Te_{25}$ | $Ge_{17.8}Sb_{33.3}Te_{48.9}$ | |
| $Ge_{25}Sb_{45}Te_{30}$ | $Ge_{15.6}Sb_{41.1}Te_{43.4}$ | |

In the instant invention, two or more chalcogenide materials may be combined in the active region of the instant devices. The materials may be interspersed or intermingled within the active region or may be deposited sequentially as one or more layers, where each layer corresponds to a homogeneous composition. In a preferred embodiment, the layers are arranged vertically between an upper contact and a lower contact with each layer extending across the lateral diameter of the active region. In another preferred embodiment, a layer having a first chemical composition is in physical contact with one terminal of the device and a layer having a second chemical composition is in physical contact with a second terminal of the device.

In one embodiment, two chalcogenide materials are included in the active region between two contacts of a chalcogenide memory or switching device. Included within this embodiment is a device in which one of the two chalcogenide materials includes an atomic concentration of Ge that is greater than or equal to 22% and the other of the two chalcogenide materials includes an atomic concentration of Ge of less than 22%. In another embodiment, one of the two chalcogenide materials includes an atomic concentration of Ge that is greater than or equal to 22% and the other of the two chalcogenide materials includes an atomic concentration of Ge between 11% and 21%. In another embodiment, one of the two chalcogenide materials includes an atomic concentration of Ge that is greater than or equal to 22% and the other of the two chalcogenide materials includes an atomic concentration of Ge between 13% and 19%. In another embodiment, one of the two chalcogenide materials includes an atomic concentration of Ge that is greater than or equal to 22% and the other of the two chalcogenide materials includes an atomic concentration of Ge between 15% and 18%. Additional embodiments related to those described in this paragraph further include Sb and/or Te. In one of these embodiments, one of the two chalcogenide materials has an atomic concentration of Sb between 22% and 65%. In another of these embodiments, one of the two chalcogenide materials has an atomic concentration of Sb between 28% and 43%. In another of these embodiments, one of the two chalcogenide materials has an atomic concentration of Te between 28% and 55%. In still another of these embodiments, one of the two chalcogenide materials has an atomic concentration of Te between 43% and 55%.

In another series of embodiments, one of the two chalcogenide materials includes an atomic concentration of Ge that is greater than or equal to 22% and the other of the two chalcogenide materials includes an atomic concentration of Ge that is less than or equal to 20% and an atomic concentration of Sb greater than or equal to 30%. In another embodiment, one of the two chalcogenide materials includes an atomic concentration of Ge that is greater than or equal to 22% and the other of the two chalcogenide materials includes an atomic concentration of Ge that is less than or equal to 16% and an atomic concentration of Sb greater than or equal to 40%. In another embodiment, one of the two chalcogenide materials includes an atomic concentration of Ge that is greater than or equal to 22% and the other of the two chalcogenide materials includes an atomic concentration of Ge that is less than or equal to 12% and an atomic concentration of Sb greater than or equal to 50%. Additional embodiments related to the embodiments of this paragraph further include Te. In one of these embodiments, in one of the two chalcogenide materials, the atomic concentration of Te is less than or equal to 50% and preferably between 20% and 50%. In another of these embodiments, one of the two chalcogenide materials has an atomic concentration of Te that is less than or equal to 40% and preferably between 30% and 40%. In another of these embodiments, one of the two chalcogenide materials has an atomic concentration of Te that is less than or equal to 30%.

Illustrative examples of devices according to the instant invention are now described:

EXAMPLE 1

In this example, the fabrication of memory devices in accordance with the instant invention having two or more chalcogenide materials in the active region is described. The device structure described in this example is a two-terminal device design having two or more chalcogenide materials disposed in a plug geometry that are in electrical contact with top and bottom electrodes. The chalcogenide materials in this example are deposited as discrete layers in a sequential fashion. The depositions occurred on a base Si wafer that included a thick $SiO_2$ surface oxide layer disposed over a pre-fabricated nitridized refractory metal or metal alloy. A plug of nitridized refractory metal or metal alloy for a bottom electrode having a diameter of approximately 600 Å was formed in the insulating layer. As described in further detail below, one or more chalcogenide or Sb layers were next deposited on the plug and surrounding oxide insulator to a total thickness of ~750 Å at 260° C. using a pulsed DC co-sputtering process. Targets of $Ge_2Sb_2Te_5$, Ge, and Sb were used in the deposition. By controlling the power, ion energetics, time of exposure and utilization of the different targets in the sputtering process, chalcogenide films of different composition were prepared. For all samples other than Sample o5737, the sputtering occurred in an Ar environment. In the preparation of Sample o5737, the sputtering environment included 90% Ar and 10% $N_2$ and this environment led to the incorporation of an undetermined amount of nitrogen into the layers.

One or more layers of $Ge_2Sb_2Te_5$, $Ge_{18}Sb_{37}Te_{45}$, and/or Sb were included in the device layers (see below). The chalcogenide layer coated the plug and extended laterally over the surrounding insulating layer. A top electrode was next in situ deposited and included a 400 Å carbon layer deposited on top of the chalcogenide layer and one or more conductive layers deposited on top of the carbon layer. The conductive layers typically included a 1000 Å molybdenum nitride layer. Appropriate lithography and patterning was performed on each device design to permit electrical testing of the devices and the devices were subjected to annealing at 300° C. for 30 minutes.

A control sample (Sample Label o5732) that included a single $Ge_2Sb_2Te_5$ layer with a thickness of 750 Å was fabricated. In the control sample, $Ge_2Sb_2Te_5$ filled the space in the pore between the upper and lower electrodes. Additional devices having the following combinations of chalcogenide layers in accordance with the instant invention were fabricated:

| Sample Label | Layer in Contact with Lower Electrode | Intermediate Layer | Layer in Contact with Upper Electrode |
| --- | --- | --- | --- |
| o5733 | $Ge_{18}Sb_{37}Te_{45}$ (150 Å) | | $Ge_2Sb_2Te_5$ (600 Å) |
| o5734 | $Ge_2Sb_2Te_5$ (600 Å) | | $Ge_{18}Sb_{37}Te_{45}$ (150 Å) |
| o5735 | $Ge_2Sb_2Te_5$ (550 Å) | | $Ge_{18}Sb_{37}Te_{45}$ (200 Å) |
| o5736 | $Ge_{18}Sb_{37}Te_{45}$ (150 Å) | $Ge_2Sb_2Te_5$ (450 Å) | $Ge_{18}Sb_{37}Te_{45}$ (150 Å) |
| o5737 | $Ge_{18}Sb_{37}Te_{45}$ (200 Å) | | $Ge_2Sb_2Te_5$ (550 Å) |
| o5738 | Sb (30 Å) | | $Ge_2Sb_2Te_5$ (750 Å) |
| o5739 | Sb (60 Å) | | $Ge_2Sb_2Te_5$ (750 Å) |
| o5740 | Sb (100 Å) | | $Ge_2Sb_2Te_5$ (750 Å) |

Each of the samples listed in the above table is identified by a sample label. The combination of chalcogenide layers included in each sample is listed along with its thickness. Some of the samples included two chalcogenide layers, other samples included an Sb layer and a layer of chalcogenide material, and one of the samples included three chalcogenide layers. The layers are listed according to whether they are in physical contact with the lower electrode, upper electrode or neither electrode (intermediate layer) in the as-processed device. Devices with only two layers include layers in contact with the upper and lower electrodes, but no intermediate layer.

The alloy $Ge_{18}Sb_{37}Te_{45}$ was selected as a representative embodiment of a low Ge content alloy and its inclusion is intended to promote the quality of the interface formed with the upper and/or lower electrodes. The layer of Sb is believed to provide benefits similar to $Ge_{18}Sb_{37}Te_{45}$ and is also included in some of the samples as a layer in contact with the lower electrode. $Ge_2Sb_2Te_5$ was selected because of its desirable high reset resistance. An illustration of the performance characteristics of several of the samples listed above are presented in the following examples.

The devices of this example are electrical devices that include a chalcogenide material, a first terminal in electrical communication with the chalcogenide material and a second terminal in electrical communication with the chalcogenide material, where one or more devices utilizing each of the chalcogenide compositions indicated above were fabricated. The operational characteristics of the devices are qualitatively similar to the behavior depicted in FIG. 1 as each device can be operated among a plurality of reset states (right-side states) or a plurality of accumulation states (left-side states) or a combination of reset and accumulation states. Depending on the composition, thicknesses and other properties of the chalcogenide layers included within the active region, characteristics such as the virgin resistance, set resistance, reset resistance and reset current varied, as described in the illustrative examples that follow.

EXAMPLE 2

This example presents selected experimental results from the electrical testing of the control sample (Sample o5732), which included only a 750 Å thick layer of $Ge_2Sb_2Te_5$ in the active region. The I-V (Current-Voltage) and R-I (Resistance-Current) characteristics of the control sample are presented. The data was obtained by applying voltage pulses with a pulse duration of 500 ns and various pulse amplitudes to the device. The voltage pulses were applied between the top and bottom electrodes of the device and the device current was measured while the pulse was applied. When the pulse concluded, the resistance of the device was measured as well. A DC bias voltage of ~0.1V-0.4V was maintained during the measurement. A series of voltage pulses beginning at ~0.2V and increasing in small increments up to a maximum voltage was applied to a series-fixed resistor ($R_{Load}$) in series with the phase-change device under test and data was obtained for each pulse. The device current and resistance were obtained as a function of pulse amplitude from the data and summarized in the form of I-V and R-I curves presented in FIGS. 2 and 3, respectively.

The I-V and R-I characteristics of the device were measured over several cycles of operation. The different cycles correspond to cycles of setting and resetting the device, beginning with the as-processed or virgin state of the device and continuing until the response characteristics stabilized. The number of cycles required to stabilize device performance is a measure of the degree or extent of formation or conditioning needed to prepare the device for its ultimate application. It is desirable to minimize, the number of cycles needed to form the device and it is expected that a higher quality interface between the chalcogenide material(s) and one or both electrodes will reduce the number of cycles needed for formation.

Figure 2:
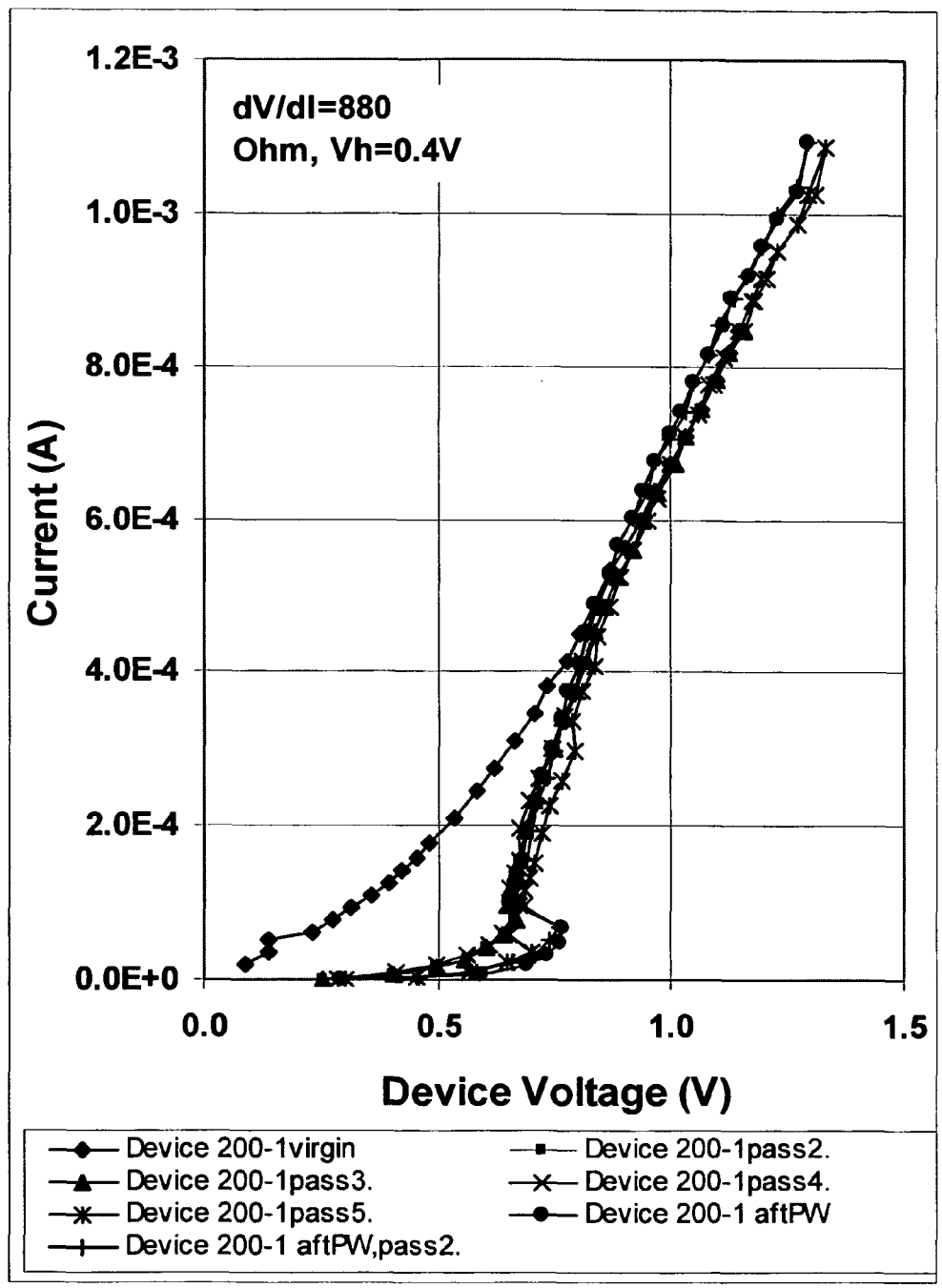
FIG. 2. Current-voltage relationship of a single layer device that includes a 750 Å thick layer of $Ge_2Sb_2Te_5$ in the active region of a two-terminal device.

The leftmost data curve (depicted with diamond (♦) symbols) shown in FIG. 2 corresponds to the I-V response observed during the first cycle of device operation. The first cycle of operation began with the as-processed device in its virgin state and extended until the device reached its reset state. The I-V response during the first cycle of operation showed a monotonic increase in current with increasing device voltage. The maximum current was sufficient to reset the device for the first time. The remaining data curves show the I-V response for subsequent cycles. Each cycle began with the device in the reset state produced by the previous cycle and an I-V response curve was obtained for each cycle. The response curves for cycles 2, 3, and 4 (depicted with square (■), triangle (▲) and cross (x) symbols, respectively) were similar to each other and also showed generally monotonic increases in current with increasing device voltage. The response curves for cycles 2, 3, and 4 were shifted to higher voltages in the low current regime of the experiment relative to the response curve obtained for cycle 1. None of the response curves through the first four cycles, however, displayed the switching transition expected for the chalcogenide material of the device. Only beginning with cycle 5 was the switching event observed, as evidenced by the switchback feature observed in the I-V curve. These results indicate that at least five cycles of operation are needed to properly condition the device for its end use. FIG. 2 also includes the I-V response for two experiments (depicted with circle (●) and plus (+) symbols) conducted after the set speed measurements described hereinbelow using different pulse conditions than were used for the other curves.

Figure 3:
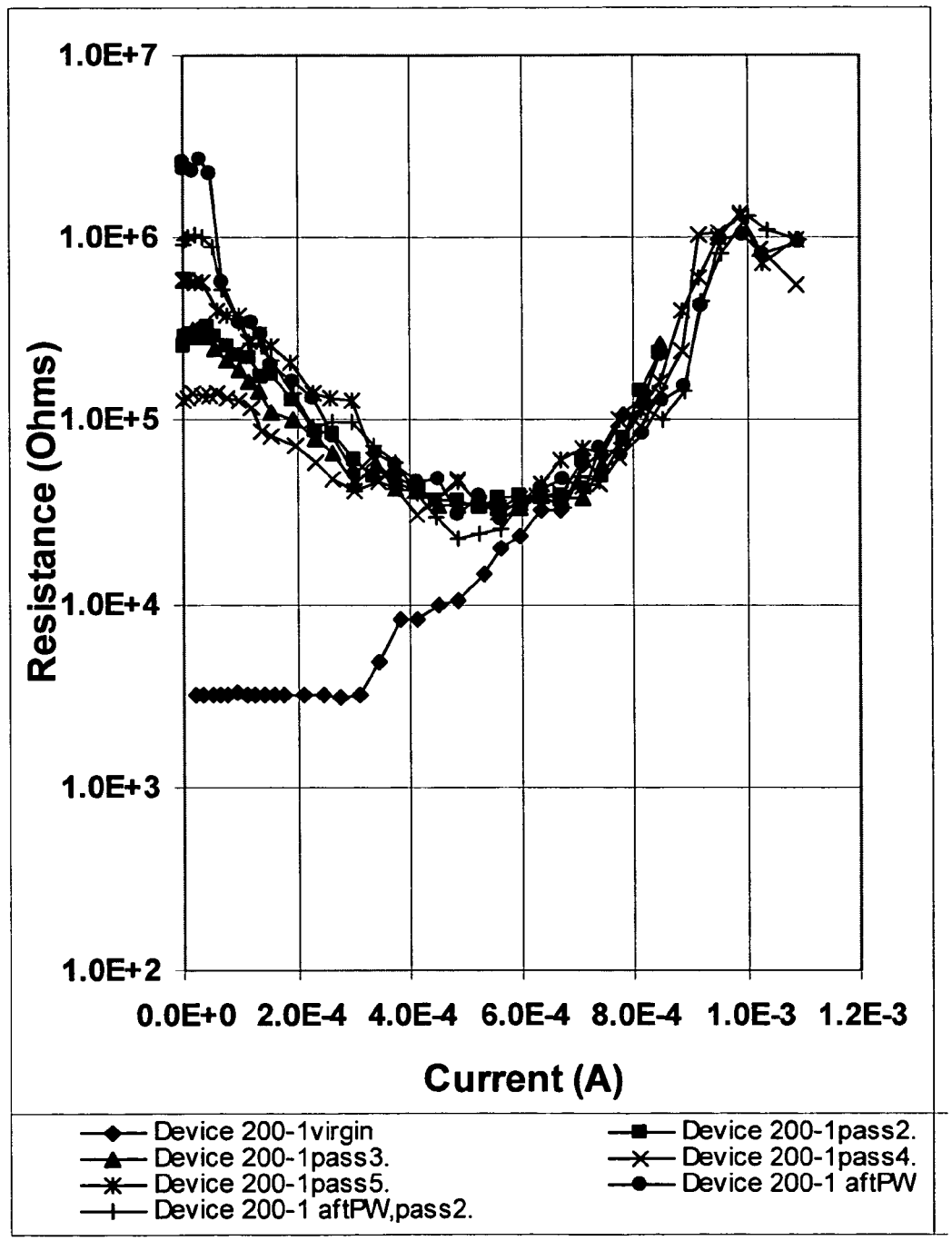
FIG. 3. Resistance-current relationship of a single layer device that includes a 750 Å thick layer of $Ge_2Sb_2Te_5$ in the active region of a two-terminal device.

A similar conclusion is drawn from the R-I results shown in FIG. 3. FIG. 3 includes the R-I response curves for the five cycles discussed above in connection with the I-V curves. The R-I response curve depicted with diamond (♦) symbols corresponds to the result obtained beginning with the virgin state of the device. The virgin resistance of the device was approximately 4 kΩ. As the current increased, resistance remained constant up to a current of slightly above 0.3 mA and then increased steadily upon further increases in current until reaching the reset state. As the experiment was continued with the second cycle, the initial resistance of the device (which corresponds to the reset resistance and which is depicted by the leftmost data point of the R-I curve associated with each cycle) fluctuated over cycles 2, 3, and 4 (depicted with square (■), triangle (▲) and cross (x) symbols, respectively) before stabilizing beginning with cycle 5 (depicted with asterisk (*) symbols. The R-I results indicate that at least five cycles of operation are needed to condition the device to ready it for its ultimate use. Two additional curves, depicted with circle (●) and plus (+) symbols, obtained after the set speed measurements described hereinbelow are also shown in FIG. 3 and were obtained with different pulse conditions than were used for the other curves.

Figure 4:
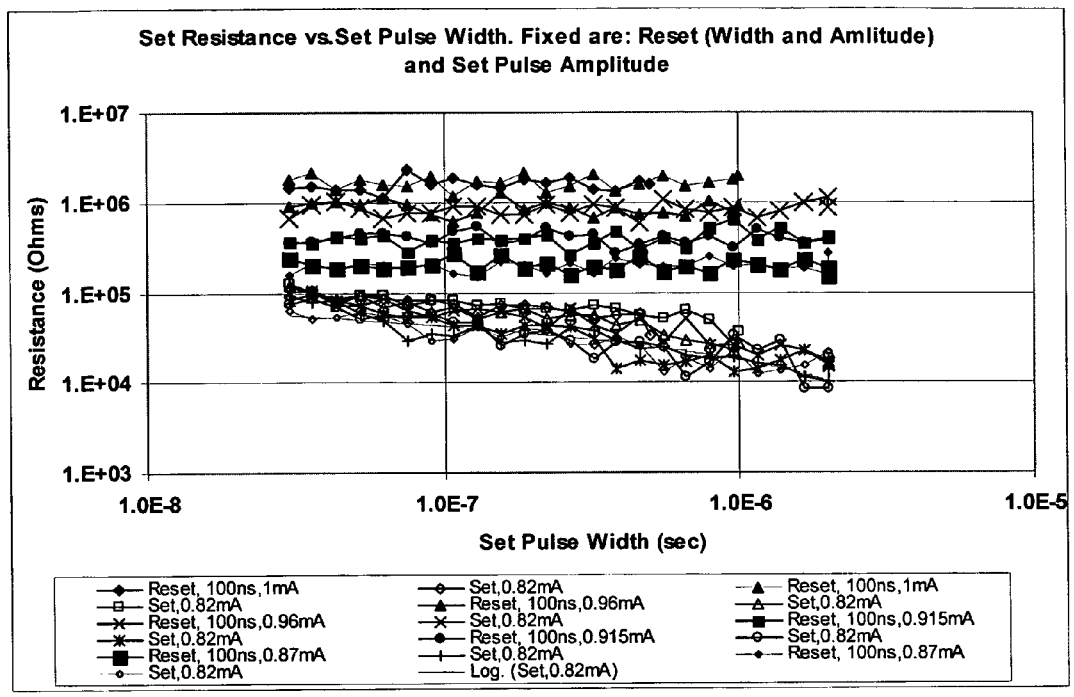
FIG. 4. Set speed characteristics of a single layer device that includes a 750 Å thick layer of $Ge_2Sb_2Te_5$ in the active region of a two-terminal device.

FIG. 4 shows the set speed characteristics of the device. The set speed was assessed by measuring the pulse duration required to transform the device from a reset state to the set state. A series of experiments was completed in which the device was first placed into an initial reset state with a reset pulse having a fixed amplitude and fixed pulse duration. The resistance of the reset state was measured and the device was next subjected to a set pulse having a fixed current amplitude and a particular pulse duration. After application of the set pulse, the resistance of the device was measured and the device was subjected to the same reset pulse used to establish the initial reset state. The experiment was repeated for each of a series of set pulse spanning a range of pulse durations and the resistance of the device in the reset state before applying the set pulse and the resistance of the device following the set pulse were plotted as a function of the pulse duration. The experiment was then repeated for several different reset pulse current amplitude conditions and the overall results are summarized in FIG. 4.

The legend shows the pulse amplitudes and pulse durations of the different reset pulses used in the series of experiments. For each set of reset pulse conditions (pulse current amplitude), a separate curve appears in FIG. 4 that shows the resistance of the device after subjecting it to those reset pulse conditions. A separate point appears on the resistance curve based on each set of reset pulse conditions for each different set pulse applied to the device after subjecting it to those reset pulse conditions. As indicated above, a series of set pulses having a fixed amplitude and various pulse durations were applied. The legend shows the set pulse amplitude used for each particular reset pulse. For example, the curve depicted with filled diamond (♦) symbols shows the reset resistance of the device after subjecting it to reset pulse conditions in which the reset pulse amplitude was 1 mA and the reset pulse duration was 100 ns. For these reset pulse conditions, a series of set pulses having a pulse amplitude of 0.82 mA and various pulse durations was applied. The resistance of the device following each set pulse was measured and is displayed with the curve depicted with unfilled diamond symbols. The resistances of the reset state and set state are both plotted as a function of the set pulse duration. The other symbols in the legend may be interpreted analogously and correspond to data curves obtained with various reset pulse current amplitude conditions and set pulse amplitudes.

To interpret the results signified by FIG. 4, it is convenient to divide the curves into two groups. One group corresponding to the curves that display the reset resistance and another group corresponding to the set resistance, where each set resistance curve is paired with one of the reset resistance curves. The group of reset resistance curves correspond to the upper half of the curves shown in FIG. 4 and exhibit a generally horizontal appearance, as would be expected since a common set of reset pulse conditions was used for each data point on the reset resistance curves. The different reset pulse conditions provided reset state resistances ranging from slightly above $10^5 \Omega$ to above $10^6 \Omega$. The group of set resistance curves corresponds to the lower half of curves shown in FIG. 4. The set resistance curves show a generally downward sloping appearance.

The data presented in FIG. 4 provides a measure of the set speed of the device. For a set pulse having a given amplitude, the set speed can be measured by the time required for the device to reach a stable set resistance. Recall from the discussion of FIG. 1 hereinabove that the resistance of the device decreases precipitously as the set state is approached. The decrease in resistance is related to the formation of a continuous crystalline pathway through the chalcogenide material and occurs when sufficient energy has been added to nucleate and/or crystallize a sufficient quantity of crystalline phase material in the chalcogenide material. When the amplitude of the set pulse is fixed, the energy provided by the pulse to the material is proportional to the pulse duration. In order to stabilize the set state from the reset state used in the experiments, a set pulse of sufficient duration must be applied. If the duration of the set pulse is too short, insufficient crystallization of the reset state of the chalcogenide material is induced to stabilize the set-state and the resistance measured after applying the set pulse is higher than the resistance of the true set state. As the duration of the set pulse applied to the reset state is increased, more of the chalcogenide material is induced to undergo crystallization and the resistance decreases. When the pulse duration is sufficient to provide the energy needed to reach the set state, the resistance levels off at a minimum value and remains at this value as the pulse duration is further increased at the fixed amplitude.

The expected variation of the resistance of the device following application of the set pulses used in this experiment is now summarized. At the shortest pulse duration, little energy is added to the chalcogenide material and the material is little perturbed from its reset state. As a result, little or no change in the resistance of the device is expected. This regime corresponds to the left side of the set resistance curves shown in FIG. 4. As the duration of the set pulse applied to the reset state is increased and more crystallization is induced, the resistance of the device is expected to continuously decrease and ultimately level off as the set state is reached. This regime corresponds to progress from left to right in FIG. 4. Based on the results shown in FIG. 4, we see that for all but the low reset amplitude curves, the set resistance curves continuously decrease without leveling off at the longest pulse durations (ca. a few microseconds) of the experiment.

EXAMPLE 3

This example presents selected experimental results from the electrical testing of a dual-layer sample (Sample o5733) that included two chalcogenide layers in the pore region of the device. The pore region of the sample included a 150 Å thick layer of $Ge_{18}Sb_{37}Te_{45}$ in contact with the lower terminal with a 600 Å thick layer of $Ge_2Sb_2Te_5$ disposed thereon and in contact with the upper terminal. The I-V, R-I, and set speed characteristics of the device were obtained as described for the control sample in EXAMPLE 2 hereinabove and the results are presented and discussed in this example.

Figure 5:
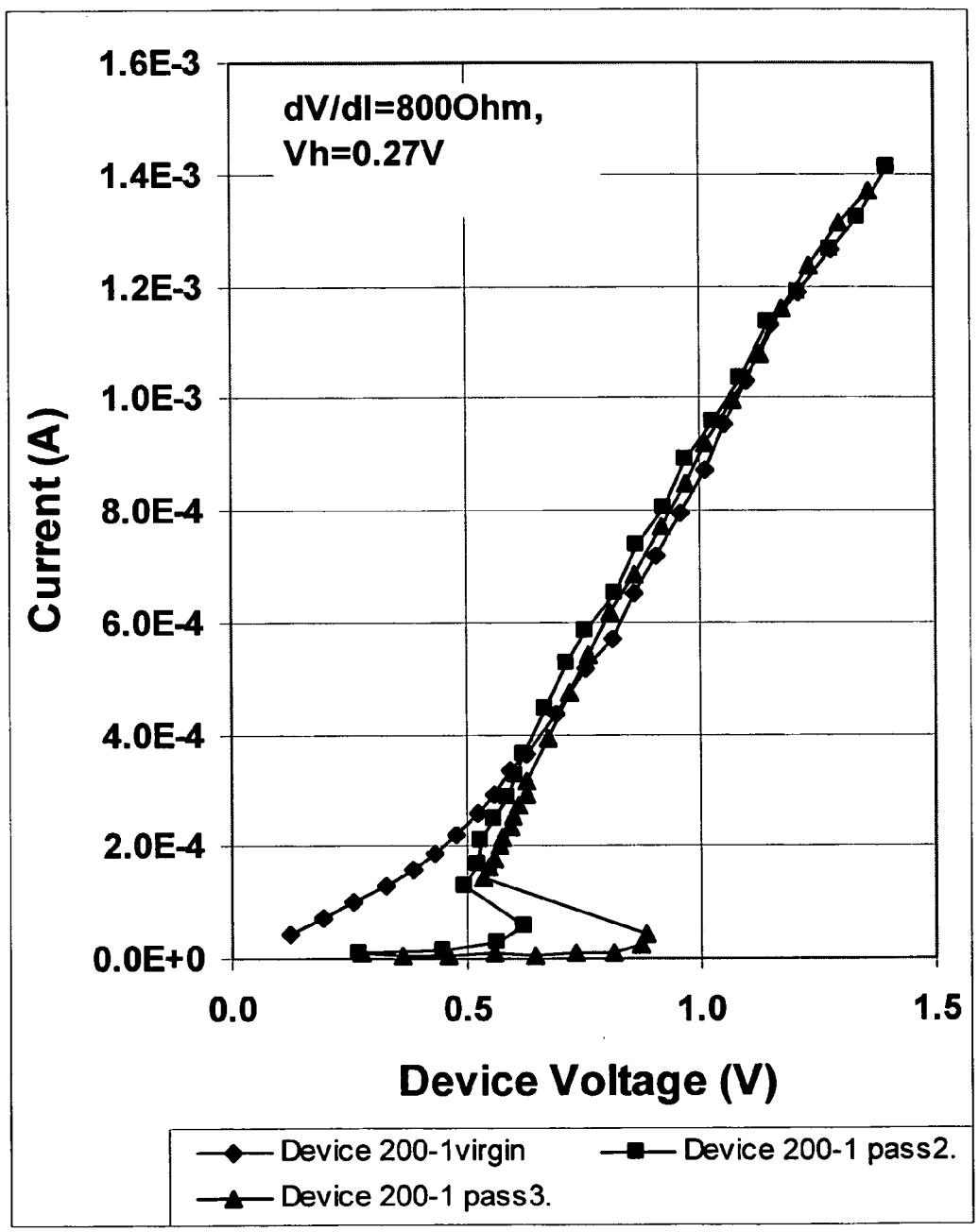
FIG. 5. Current-voltage relationship of a dual layer device that includes a 150 Å thick layer of $Ge_{18}Sb_{37}Te_{45}$ and a 600 Å thick layer of $Ge_2Sb_2Te_5$ in the active region of a two-terminal device.

The I-V results are shown in FIG. 5. The leftmost data curve (depicted with diamond (♦) symbols) shown in FIG. 5 corresponds to the I-V response observed during the first cycle of device operation. The first cycle of operation began with the as-processed device in its virgin state and extended until the device reached its reset state. The I-V response during the first cycle of operation showed a monotonic increase in current with increasing device voltage. The maximum current was sufficient to reset the device for the first time. The remaining data curves show the I-V response for subsequent cycles. Each cycle began with the device in the reset state produced by the previous cycle. The I-V response curve for cycle 2 is depicted with square (■) symbols and shows a shift to higher voltages in the low current regime as well as an indication of a switching event. The I-V response curve for cycle 3 is depicted with triangle (▲) symbols and displays a fully developed switching transition. These results indicate that only two cycles of operation are needed to properly condition the device for its end use. When compared to the results discussed for EXAMPLE 2 hereinabove, we see that inclusion of a Ge-lean chalcogenide material ($Ge_{18}Sb_{37}Te_{45}$) in contact with the lower terminal facilitates the process of forming or conditioning device. Fewer cycles are needed to ready the device for practical application.

Figure 6:
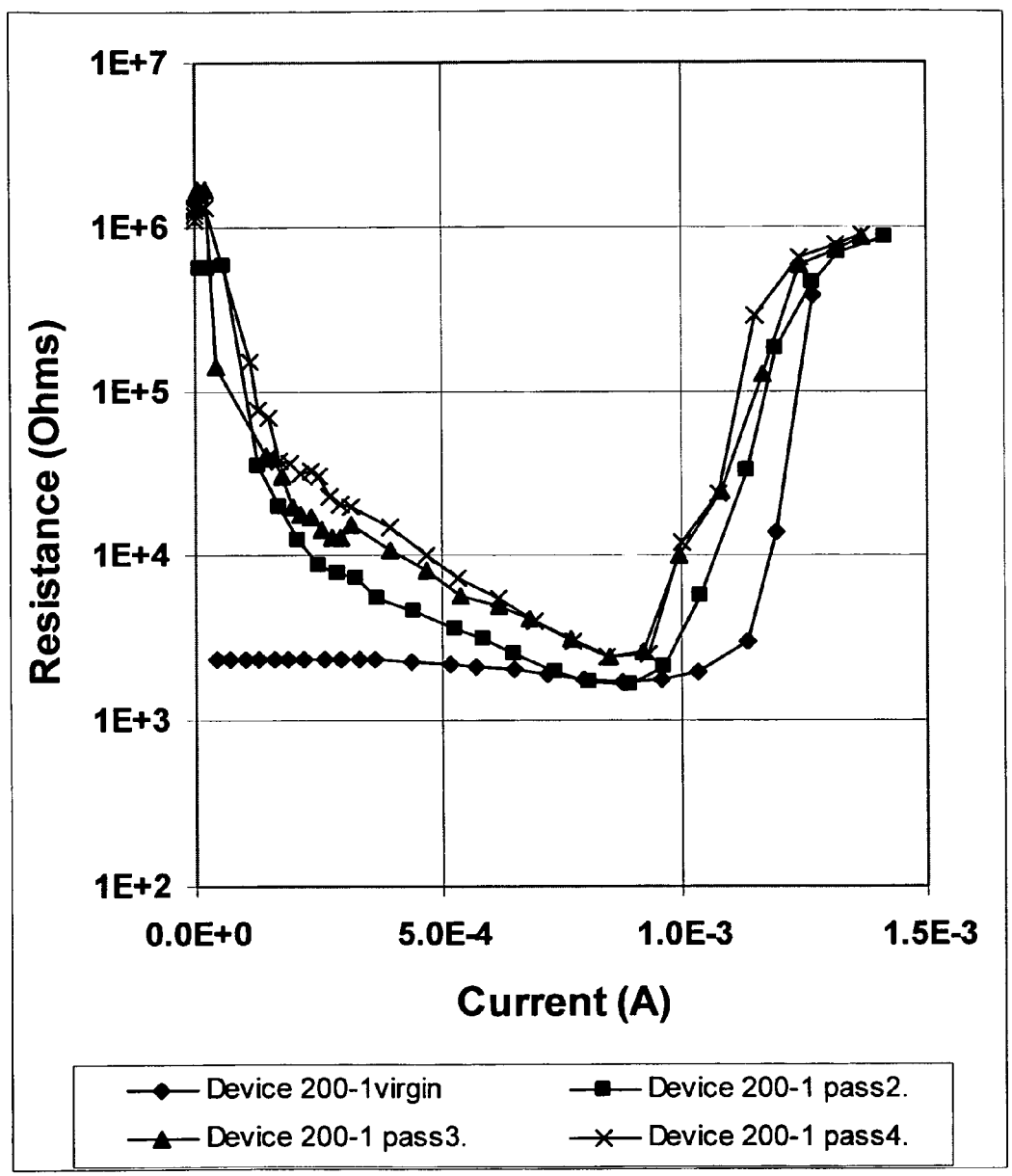
FIG. 6. Resistance-current relationship of a dual layer device that includes a 150 Å thick layer of $Ge_{18}Sb_{37}Te_{45}$ and a 600 Å thick layer of $Ge_2Sb_2Te_5$ in the active region of a two-terminal device.

A similar conclusion is drawn from the R-I results shown in FIG. 6. FIG. 6 includes the R-I response curves for the first four cycles of operation of the device. The R-I response curve depicted with diamond (♦) symbols corresponds to the result obtained beginning with the virgin state of the device. The virgin resistance of the device was approximately 3 kΩ. As the current increased, resistance remained constant up to a current of slightly above 1 mA and then increased steadily upon further increases in current until reaching the reset state. As the experiment was continued, the initial resistance of the device (which corresponds to the reset resistance and which is depicted by the leftmost data point of the R-I curve associated with each cycle) was nearly stabilized at the beginning of cycle 2 (which is depicted with square (■) symbols) and was stabilized at the beginning of cycle 3 (which is depicted with triangle (▲) symbols). The set resistance of the device was also stabilized in cycle 3. The R-I curve for cycle 4 (which is depicted with cross (x) symbols) was very similar to the R-I curve for cycle 3. The R-I results indicate that about two cycles of operation are needed to condition the device to ready it for its ultimate use. The results further show the similarity of the virgin resistance and stabilized set state resistance of the device.

Figure 7:
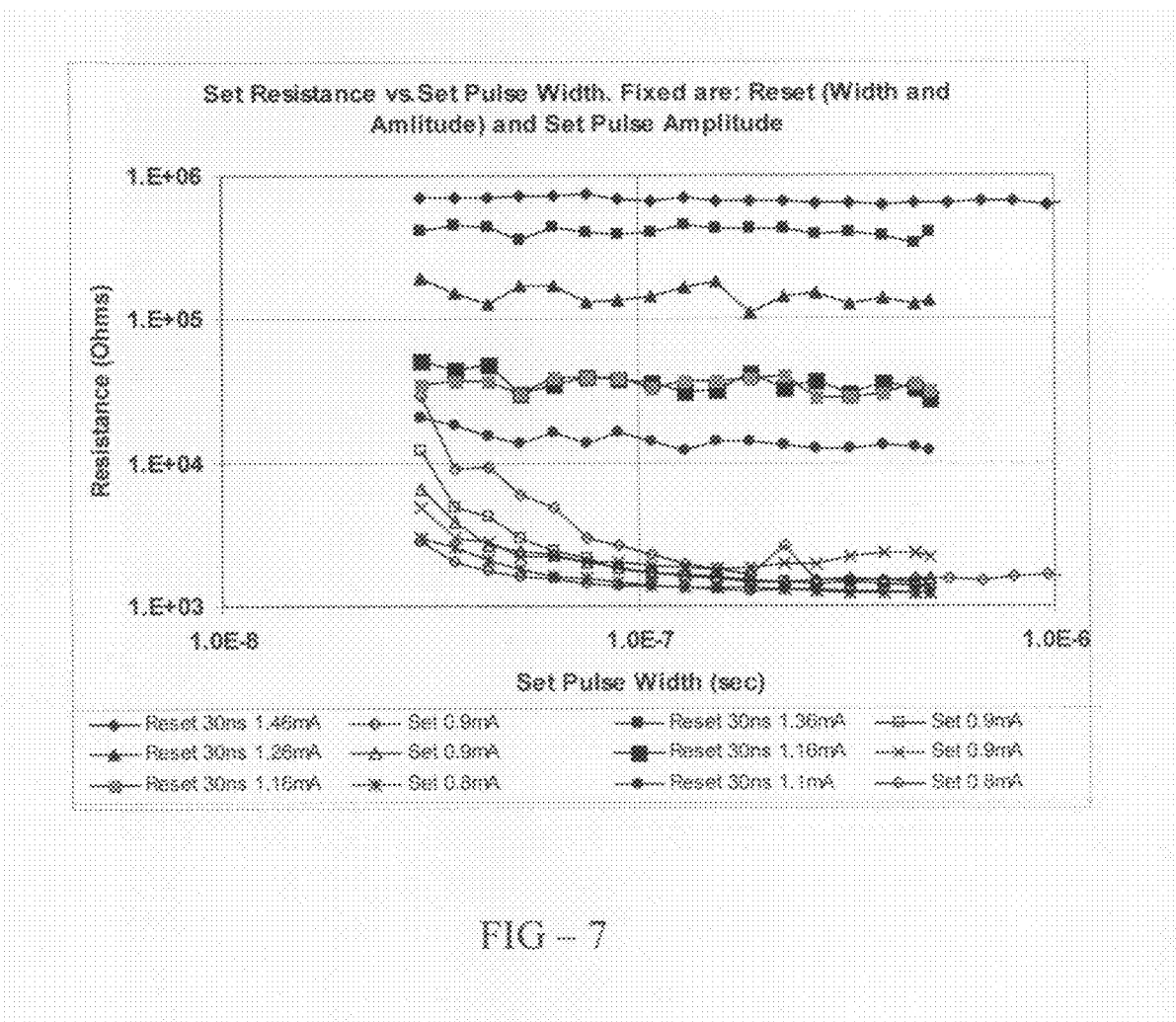
FIG. 7. Set speed characteristics of a dual layer device that includes a 150 Å thick layer of $Ge_{18}Sb_{37}Te_{45}$ and a 600 Å thick layer of $Ge_2Sb_2Te_5$ in the active region of a two-terminal device.

FIG. 7 shows the set speed characteristics of the device. As discussed in EXAMPLE 2 hereinabove, the set speed was assessed by evaluating the resistance of the device after applying a series of set pulses having a fixed amplitude and various pulse durations. The pulse duration needed to obtain a stabilized set resistance provides a measure of the set speed of the device. As discussed in connection with FIG. 4, the generally horizontal group of curves corresponds to the reset resistance of the device upon application of reset pulses having the amplitudes (1.1 mA-1.46 mA) and duration (30 ns) indicated in the legend. The remaining group of curves corresponds to the resistance of the device after applying a set pulse having a fixed amplitude (0.8 mA or 0.9 mA, also indicated in the legend) and various pulse durations. The set pulse amplitude associated with each set of reset pulse conditions is indicated in the legend.

As expected, the resistance curves for the reset state were generally horizontal, indicating achievement of a consistent and reproducible reset state for a given set of reset pulse conditions. The resistance curves for the set states exhibited a downward slope at short time intervals and ultimately leveled off as the set pulse duration was increased. The data indicate that the set resistance stabilized for pulse durations at or slightly longer than 0.1 μs. When compared with the results shown in FIG. 4, the time required to realize a stable set resistance was reduced by approximately an order of magnitude by including a layer of a Ge-lean chalcogenide material in the active region directly above the plug bottom electrode. The shorter times indicate a much higher set speed for the device when a Ge-lean chalcogenide material is included in the active region.

A comparison of FIG. 6 with FIG. 3 further indicates that the advantageous set speed did not compromise the saturated reset resistance of the device. FIG. 6 and FIG. 3 both show a saturated reset resistance of about $10^6 \Omega$. The device of this example thus illustrates a device that simultaneously exhibits a high reset resistance and high set speeds. By combining a Ge-lean material (which promotes high set speed) and $Ge_2Sb_2Te_5$ (which promotes a high reset resistance) in the active region of the device, the advantages of both materials are realized.

EXAMPLE 4

This example presents selected experimental results from the electrical testing of a dual-layer sample (Sample o5735) that included two chalcogenide layers in the pore region of the device. The pore region of the sample included a 550 Å thick layer of $Ge_2Sb_2Te_5$ in contact with the lower terminal with a 200 Å thick layer of $Ge_{18}Sb_{37}Te_{45}$ with disposed thereon and in contact with the upper terminal. The I-V, R-I, and set speed characteristics of the device were obtained as described for the control sample in EXAMPLE 2 hereinabove and the results are presented and discussed in this example.

Figure 8:
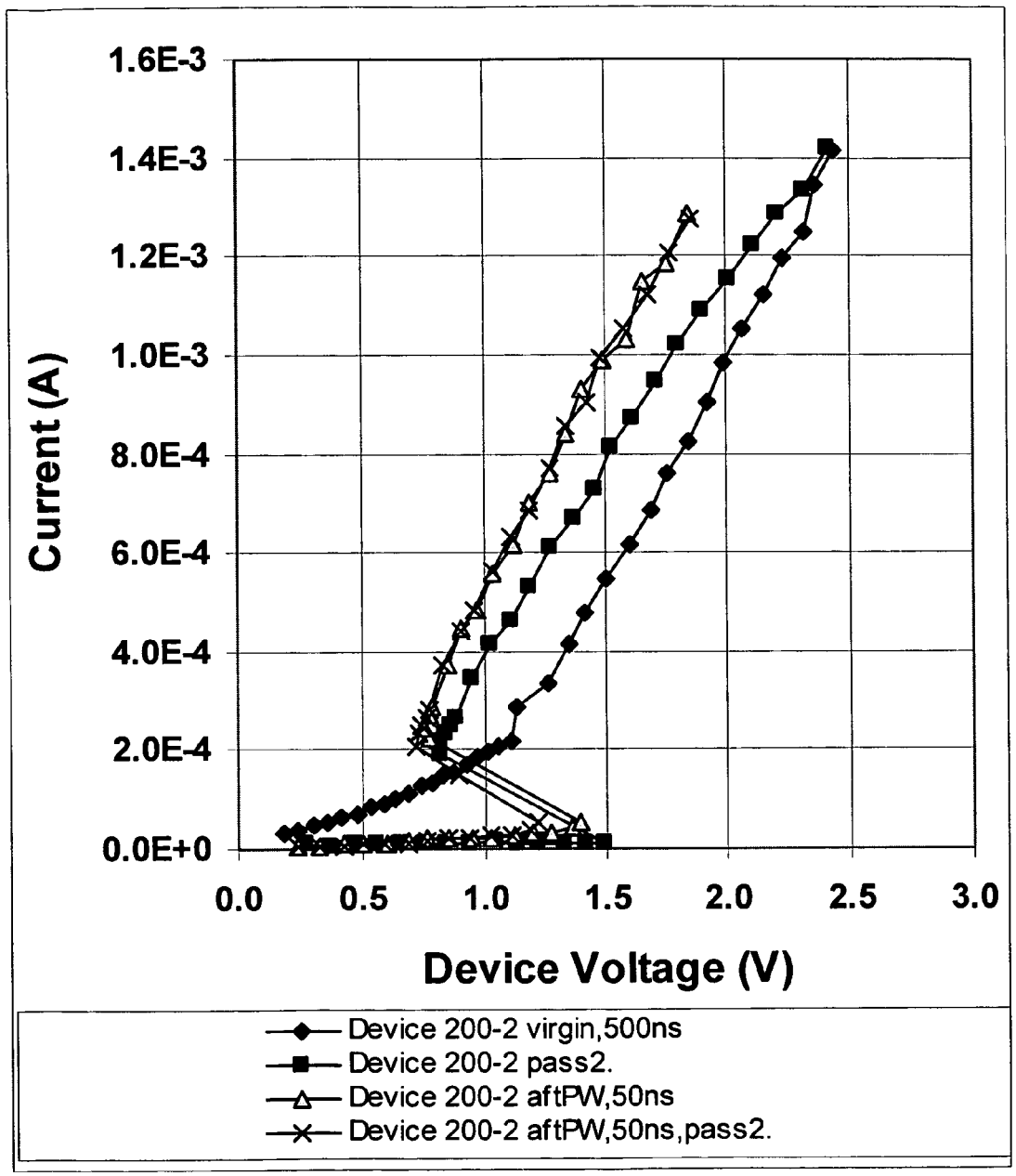
FIG. 8. Current-voltage relationship of a dual layer device that includes a 200 Å thick layer of $Ge_{18}Sb_{37}Te_{45}$ and a 550 Å thick layer of $Ge_2Sb_2Te_5$ in the active region of a two-terminal device.
Figure 9:
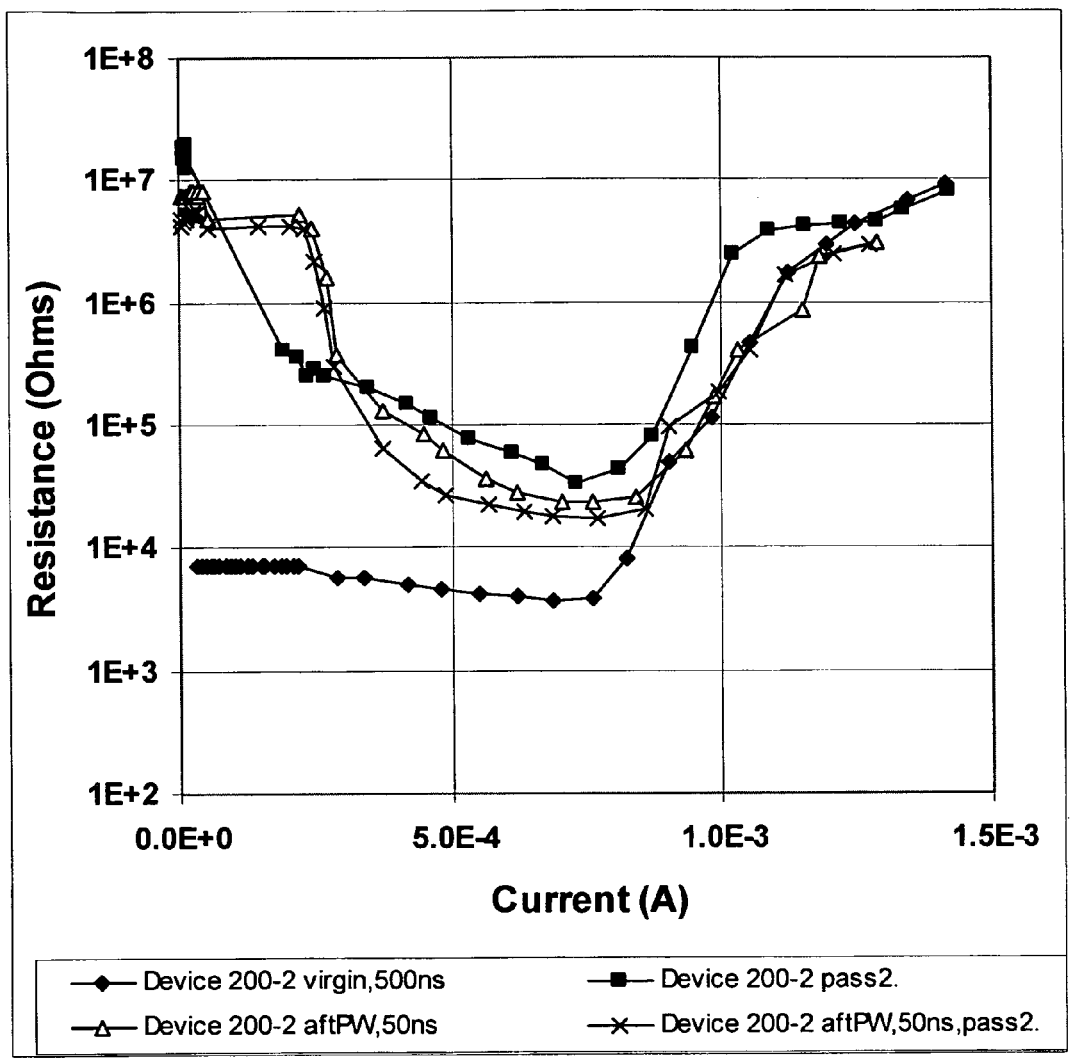
FIG. 9. Resistance-current relationship of a dual layer device that includes a 200 Å thick layer of $Ge_{18}Sb_{37}Te_{45}$ and a 550 Å thick layer of $Ge_2Sb_2Te_5$ in the active region of a two-terminal device.

The I-V results are shown in FIG. 8. The data curve depicted with diamond (♦) symbols shown in FIG. 8 corresponds to the I-V response observed during the first cycle of device operation. The first cycle of operation began with the as-processed device in its virgin state and extended until the device reached its reset state. The I-V response during the first cycle of operation showed a monotonic increase in current with increasing device voltage. The maximum current was sufficient to reset the device for the first time. The I-V response curve for cycle 2 is depicted with square (■) symbols and shows a shift to higher voltages in the low current regime as well as a well-developed switching event. The response curve for cycle 3 (not shown) was substantially similar to the one obtained for cycle 2. This result indicates that inclusion of a layer of a low-Ge chalcogenide material ($Ge_{18}Sb_{37}Te_{45}$) in the pore in contact with the upper terminal facilitates the conditioning or formation process by reducing the number of cycles needed to ready the device for practical operation. A similar conclusion was reached from the R-I experiments. FIG. 9 shows R-I curves for the initial cycle of operation (depicted with diamond (♦) symbols) and second cycle of operation (depicted with square (■) symbols). R-I curves obtained for subsequent cycles were substantially similar to that obtained for cycle 2, a result that indicates that one cycle of operation is needed to condition the device when a layer of Ge-lean material is included in the pore in contact with the upper terminal. The curves depicted with triangle (▲) and cross (x) symbols in FIGS. 8 and 9 correspond to I-V and R-I cycles obtained after completion of the set speed results described hereinbelow and were obtained with different pulse conditions than the other curves.

Figure 10:
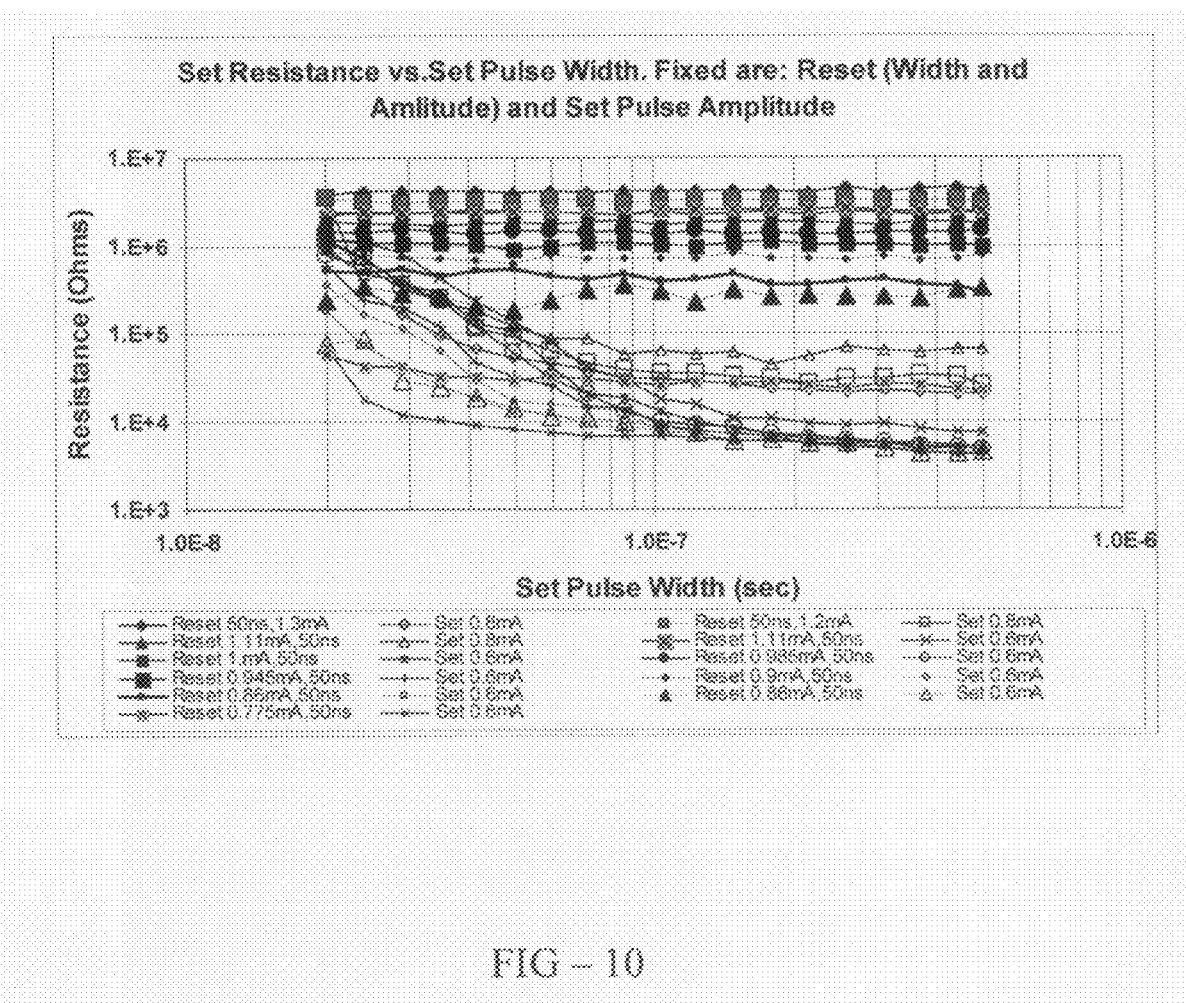
FIG. 10. Set speed characteristics of a dual layer device that includes a 200 Å thick layer of $Ge_{18}Sb_{37}Te_{45}$ and a 550 Å thick layer of $Ge_2Sb_2Te_5$ in the active region of a two-terminal device.

The set speed characteristics were obtained as described in EXAMPLES 2 and 3 hereinabove and are presented in FIG. 10. FIG. 10 includes a group of generally horizontal reset resistance curves, each with a corresponding generally downward sloping set resistance curve. The conditions used for the reset and set pulses are listed in the legend. The reset-pulses had a duration of 50 ns and amplitudes ranging from 0.775 mA to 1.3 mA. The set pulses had amplitudes of 0.6 mA and 0.8 mA. The principal result of the experiments summarized in FIG. 10 is the observation of a general leveling off of the set resistance curves for pulse durations at or slightly above 0.1 μs. When compared with the results shown in FIG. 4 for the control sample, the time required to realize a stable set resistance was reduced by approximately an order of magnitude by including a layer of a Ge-lean chalcogenide material in the active region. The shorter times indicate a much higher set speed for the device when a Ge-lean chalcogenide material is included in the active region.

A comparison of FIG. 9 with FIG. 3 further indicates that the advantageous set speed did not compromise the saturated reset resistance of the device. FIG. 9 and FIG. 3 both show a saturated reset resistance at or above $10^6 \Omega$. The device of this example thus illustrates a device that simultaneously exhibits a high reset resistance and high set speeds. By combining a Ge-lean material (which promotes high set speed) and $Ge_2Sb_2Te_5$ (which promotes a high reset resistance) in the active region of the device, the advantages of both materials are realized.

EXAMPLE 5

This example presents selected experimental results from the electrical testing of a tri-layer sample (Sample o5736) that included three chalcogenide layers in the active region of the device. The active region of the sample included a 150 Å thick lower layer of $Ge_{18}Sb_{37}Te_{45}$ in contact with the lower terminal A 450 Å thick intermediate layer of $Ge_2Sb_2Te_5$ was deposited on the lower layer and a 150 Å thick upper layer of $Ge_{18}Sb_{37}Te_{45}$ was deposited on the intermediate layer. The upper layer was in contact with the upper terminal. The I-V, R-I, and set speed characteristics of the tri-layer device were obtained, unless noted otherwise, as described for the control sample in EXAMPLE 2 hereinabove and the results are presented and discussed in this example.

Figure 11:
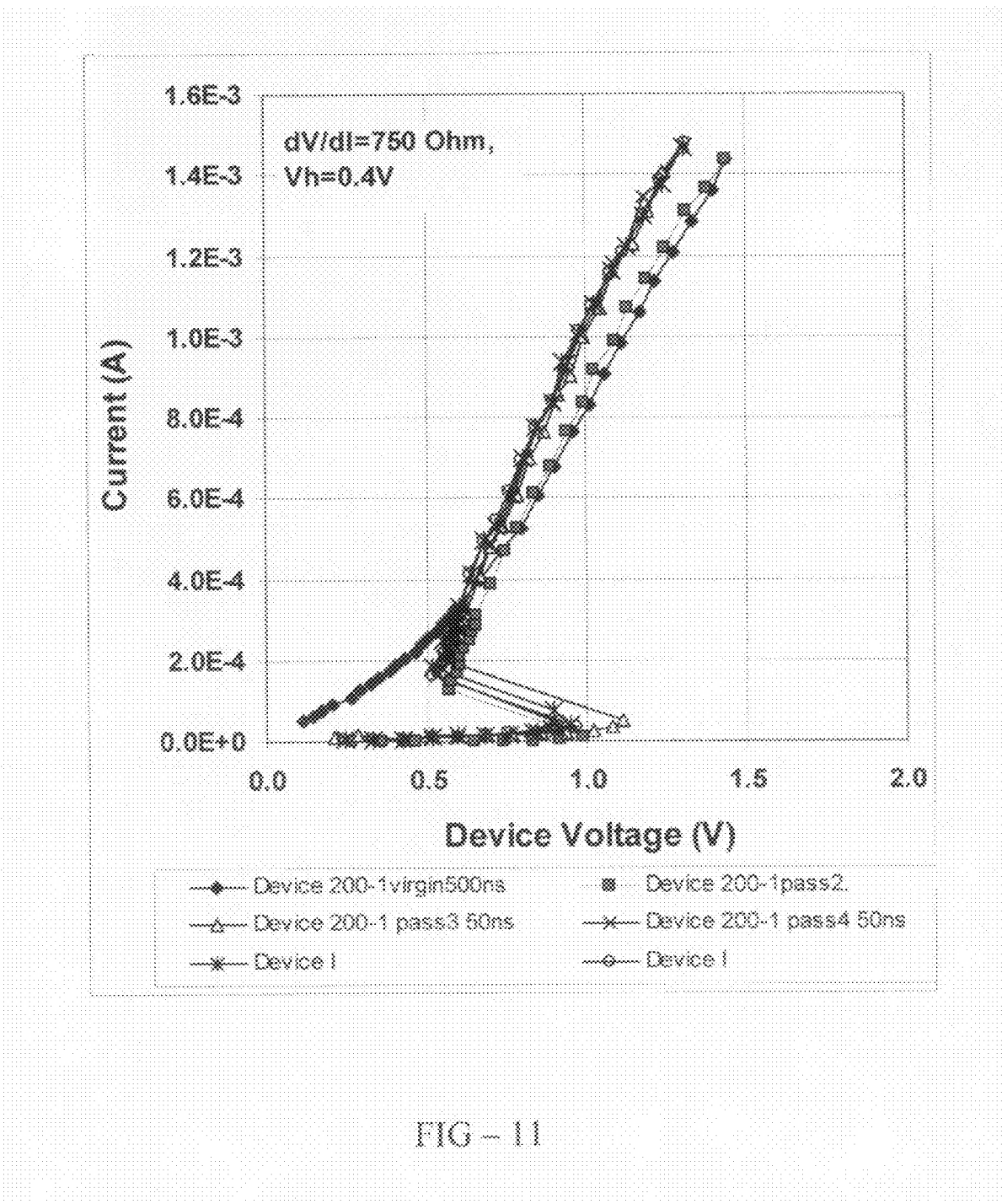
FIG. 11. Current-voltage relationship of a tri-layer device that includes a first 150 Å thick layer of $Ge_{18}Sb_{37}Te_{45}$, a 450 Å thick layer of $Ge_2Sb_2Te_5$ and a second 150 Å thick layer of $Ge_{18}Sb_{37}Te_{45}$ in the active region of a two-terminal device.

The I-V results are shown in FIG. 11. The data curve depicted with diamond (♦) symbols shown in FIG. 11 corresponds to the I-V response observed during the first cycle of device operation using a 500 ns pulse duration. The first cycle of operation began with the as-processed device in its virgin state and extended until the device reached its reset state. The I-V response during the first cycle of operation showed a monotonic increase in current with increasing device voltage. The maximum current was sufficient to reset the device for the first time. The I-V response curve for cycle 2, also obtained with a 500 ns pulse duration, is depicted with square (■) symbols and shows a shift to higher voltages in the low current regime as well as a well-developed switching event, a feature indicative of a substantially fully conditioned device. The response curves for cycles 3 and 4 were obtained with 50 ns pulses and are depicted with triangle (▲) and cross (x) symbols, respectively, and also attest to the well-conditioned state of the device. The I-V results indicate that inclusion of layers of a low-Ge chalcogenide material (e.g. $Ge_{18}Sb_{37}Te_{45}$) in the pore in contact with both the upper and lower terminals facilitates the conditioning or formation process. The number of cycles needed to ready the device for practical operation is reduced (to one) relative to the control device discussed in EXAMPLE 2. A similar conclusion may be drawn from the R-I experiments shown in FIG. 12, which shows the R-I curves for the four cycles of operation included in FIG. 11.

Figure 13:
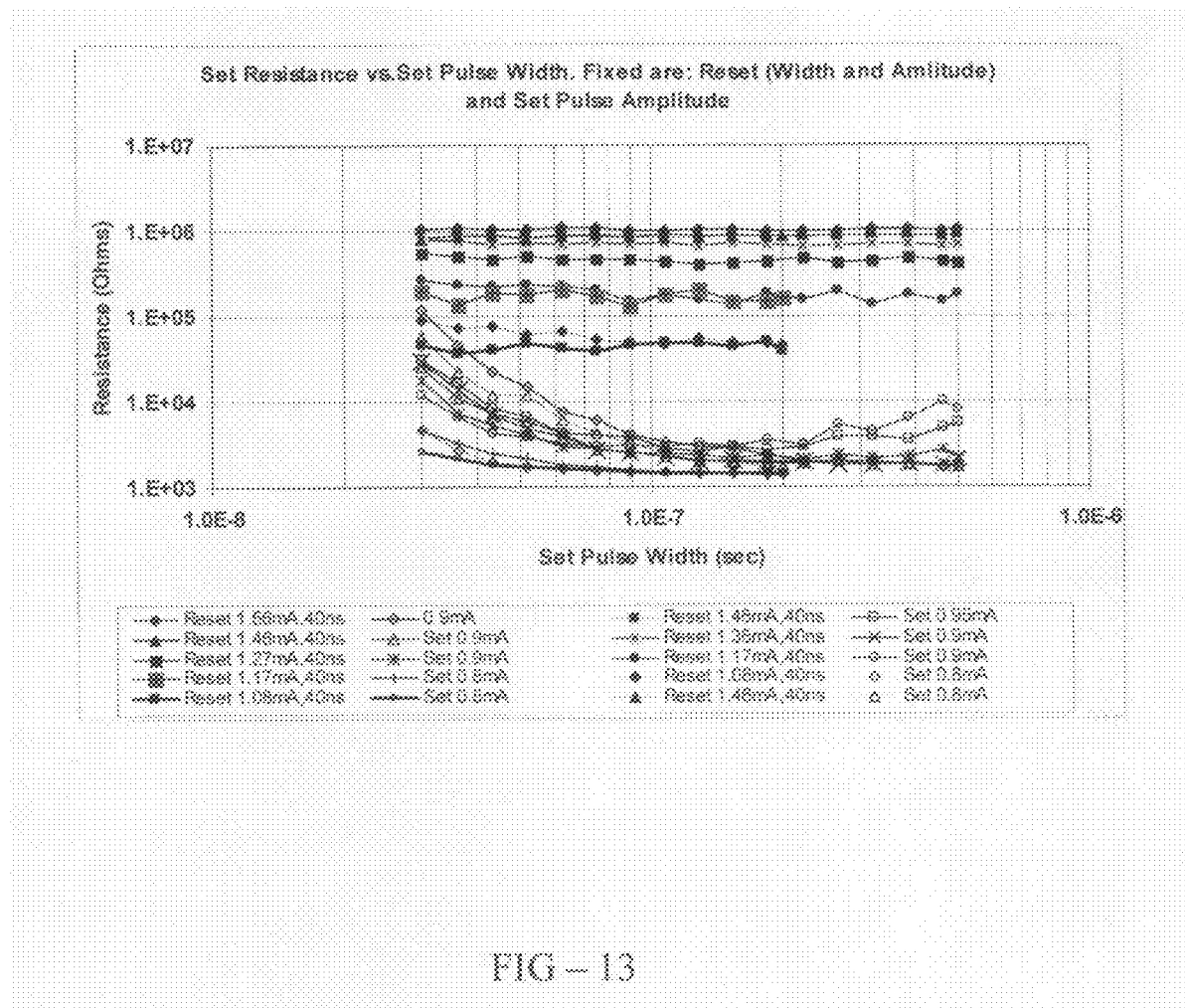
FIG. 13. Set speed characteristics of a tri-layer device that includes a first 150 Å thick layer of $Ge_{18}Sb_{37}Te_{45}$, a 450 Å thick layer of $Ge_2Sb_2Te_5$ and a second 150 Å thick layer of $Ge_{18}Sb_{37}Te_{45}$ in the active region of a two-terminal device.

The set speed characteristics of the tri-layer device were obtained as described in EXAMPLES 2 and 3 hereinabove and are presented in FIG. 13. FIG. 13 includes a group of generally horizontal reset resistance curves, each with a corresponding generally downward sloping set resistance curve. The conditions used for the reset and set pulses are listed in the legend. The reset pulses had a duration of 40 ns and amplitudes ranging from 1.08 mA to 1.56 mA. The set pulses had amplitudes of 0.8 mA, 0.9 mA and 0.95 mA. The principal result of the experiments summarized in FIG. 13 is the observation of a general leveling off of the set resistance curves for pulse durations at or slightly above 0.1 μs. When compared with the results shown in FIG. 4 for the control sample, the time required to realize a stable set resistance was significantly reduced by including upper and lower layers of a Ge-lean chalcogenide material in contact with the upper and lower terminals of the device. The shorter times indicate a much higher set speed for the device when a Ge-lean chalcogenide material is included in the active region. (The upward turn of the set resistance curves at the longer set pulse durations of the experiment indicates that the longer pulse durations are initiating a transformation of the device away from the set state toward a reset state.)

Figure 12:
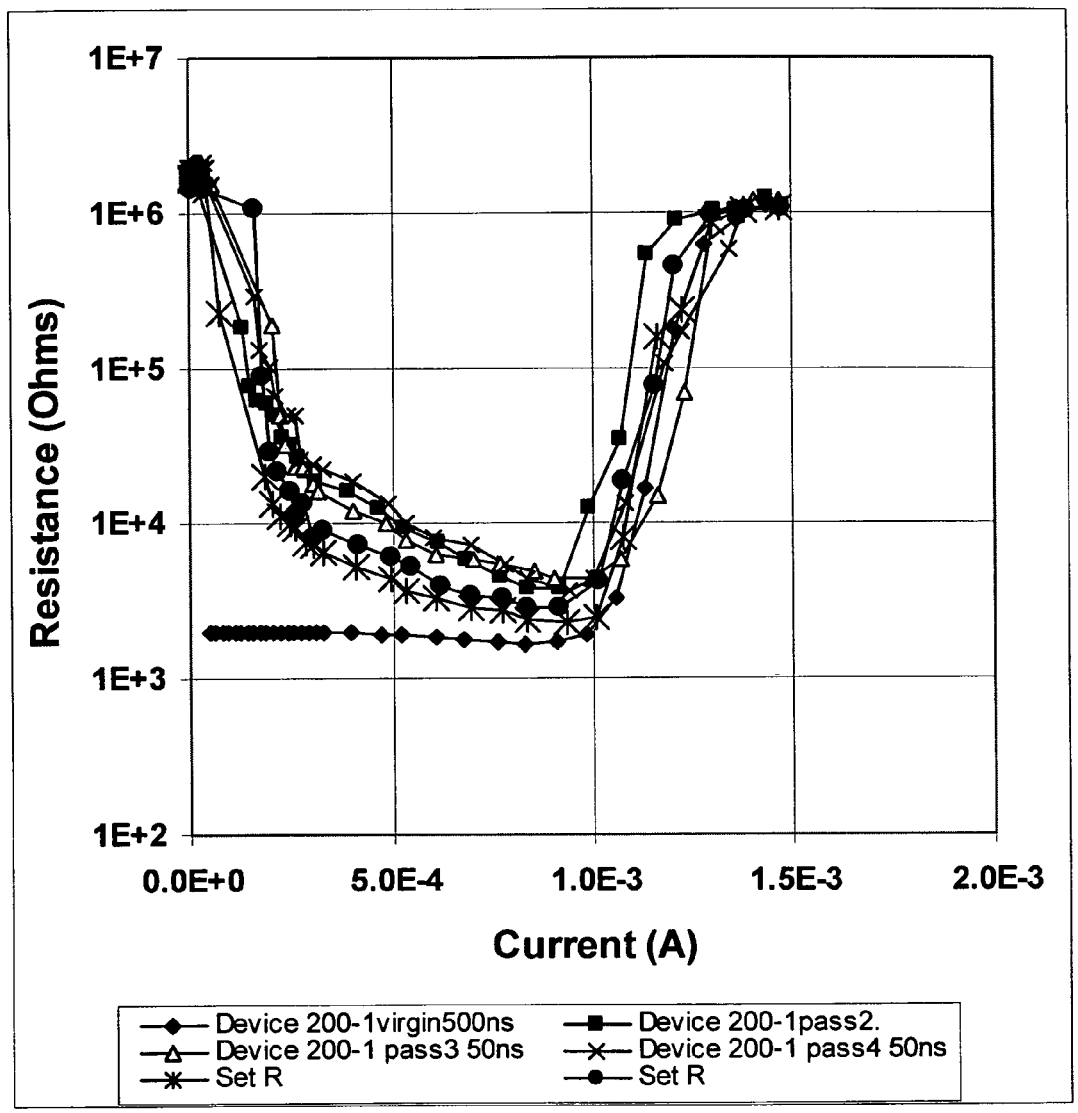
FIG. 12. Resistance-current relationship of a tri-layer device that includes a first 150 Å thick layer of $Ge_{18}Sb_{37}Te_{45}$, a 450 Å thick layer of $Ge_2Sb_2Te_5$ and a second 150 Å thick layer of $Ge_{18}Sb_{37}Te_{45}$ in the active region of a two-terminal device.

A comparison of FIG. 12 with FIG. 3 further indicates that the advantageous set speed did not compromise the saturated reset resistance of the device. FIG. 12 and FIG. 3 both show a saturated reset resistance of about $10^6 \Omega$. The device of this example thus illustrates a device that simultaneously exhibits a high reset resistance and high set speeds. In addition, the device exhibits a contrast of more than two orders of magnitude between resistances of the reset and set states.

EXAMPLE 6

This example presents selected experimental results from the electrical testing of a dual layer sample (Sample o5739) that included a layer of Sb and a layer of chalcogenide material in the active region of the device. The sample included a 60 Å thick lower layer of Sb in contact with the lower terminal and a 750 Å thick layer of $Ge_2Sb_2Te_5$ deposited thereon. The layer of $Ge_2Sb_2Te_5$ was in contact with the upper terminal.

Figure 14:
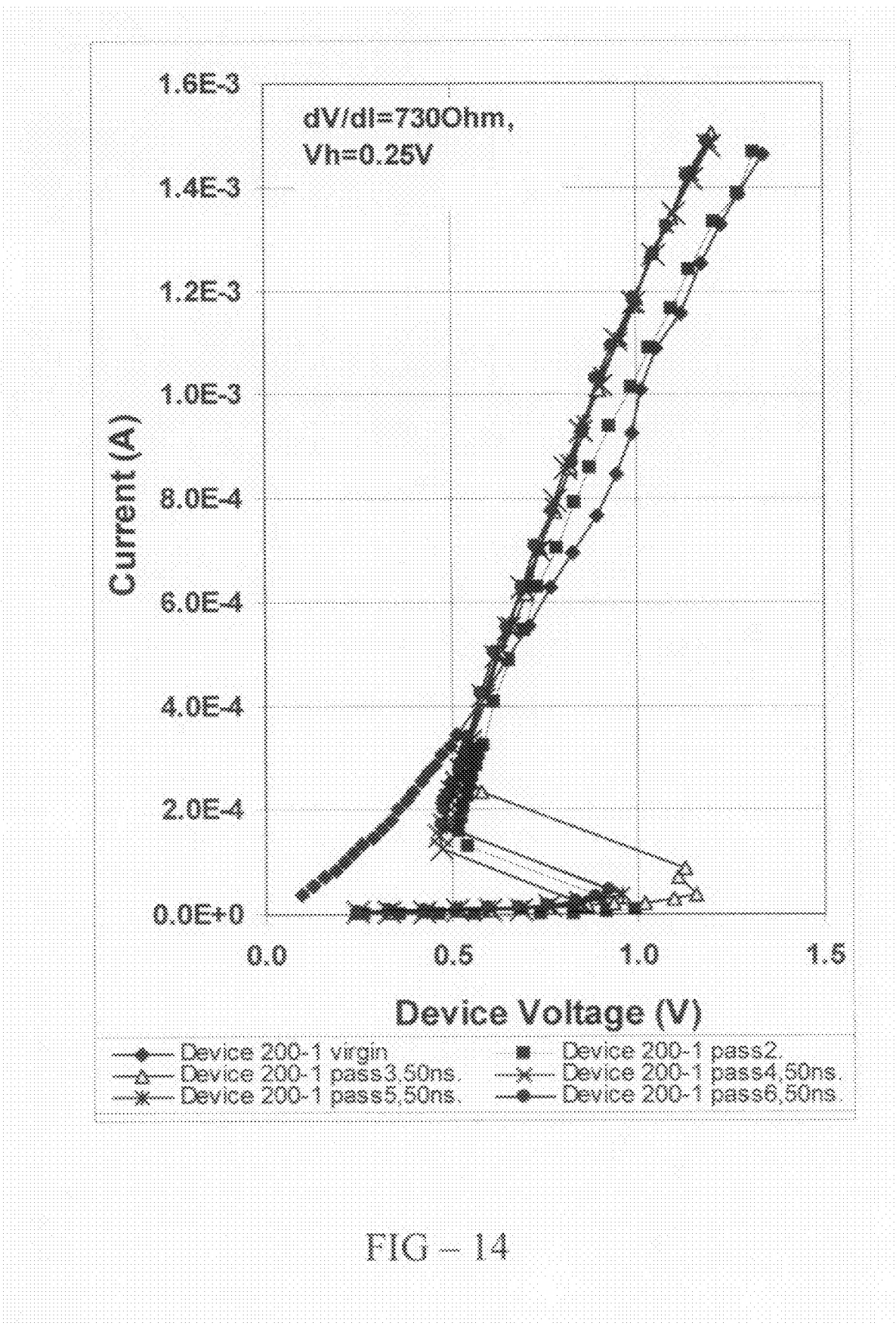
FIG. 14. Current-voltage relationship of a dual layer device that includes a 60 Å thick layer of Sb and a 750 Å thick layer of $Ge_2Sb_2Te_5$ in the active region of a two-terminal device.
Figure 15:
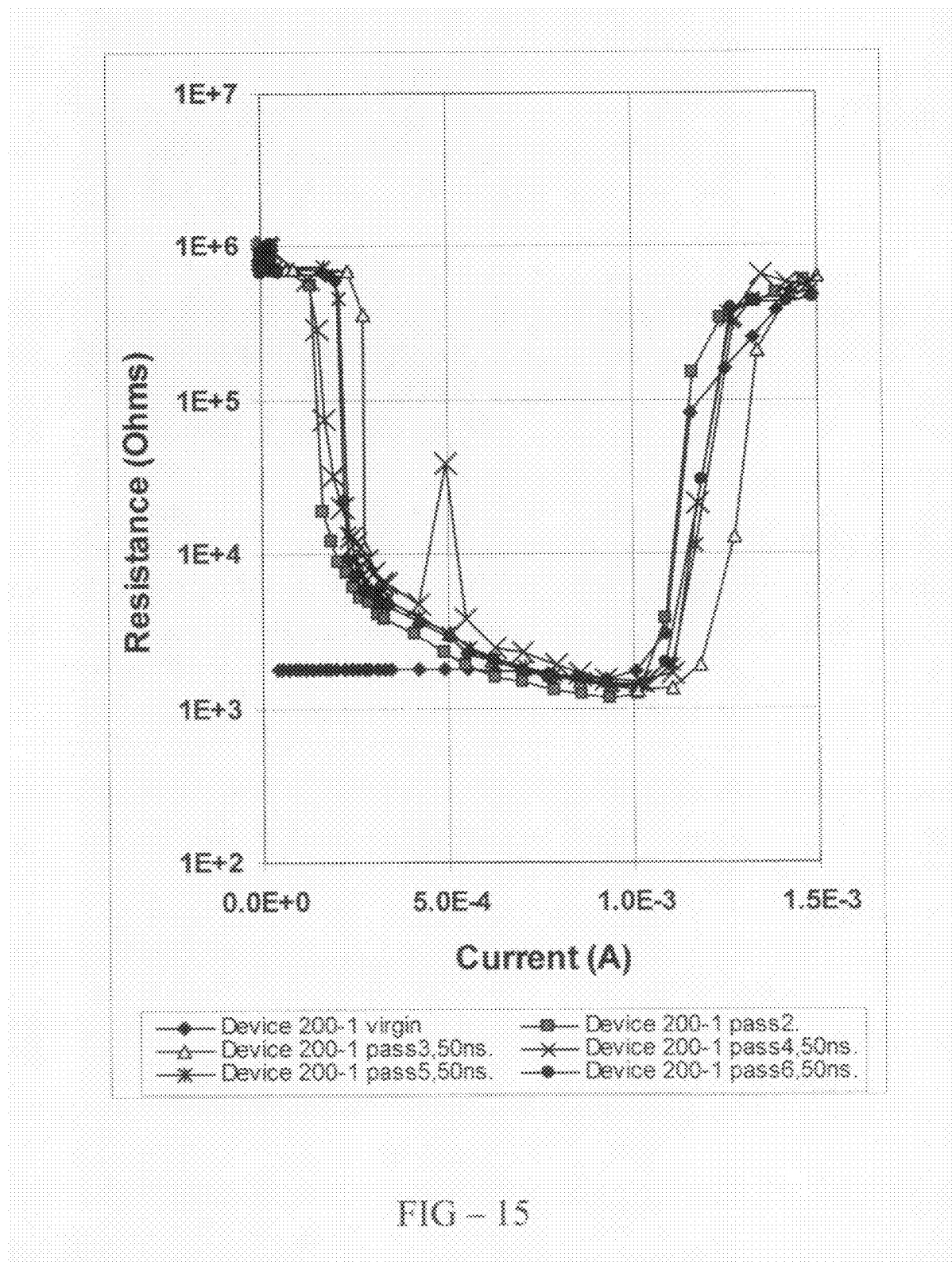
FIG. 15. Resistance-current relationship of a dual layer device that includes a 60 Å thick layer of Sb and a 750 Å thick layer of $Ge_2Sb_2Te_5$ in the active region of a two-terminal device.

The I-V, R-I, and set speed characteristics of the device were obtained, unless noted otherwise, as described for the control sample in EXAMPLE 2 hereinabove and the results are presented and discussed in this example. The I-V results are shown in FIG. 14. The data curve depicted with diamond (♦) symbols shown in FIG. 14 corresponds to the I-V response observed during the first cycle of device operation using a 500 ns pulse duration. The first cycle of operation began with the as-processed device in its virgin state and extended until the device reached its reset state. The I-V response during the first cycle of operation showed a monotonic increase in current with increasing device voltage. The maximum current was sufficient to reset the device for the first time. The I-V response curve for cycle 2, also obtained with a 500 ns pulse duration, is depicted with square (■) symbols and shows a shift to higher voltages in the low current regime as well as a well-developed switching event, a feature indicative of a substantially fully conditioned device. The response curves for cycles 3, 4, 5, and 6 were obtained with 50 ns pulses and are depicted with triangle (▲), cross (x), asterisk (*), and circle (●) symbols, respectively. The I-V response curves for cycles 3-6 also attest to the establishment of a well-conditioned state of the device over the course of a small number of formation cycles. The I-V results indicate that inclusion of a layer of Sb in the pore in contact with the lower terminal facilitates the conditioning or formation process. A similar conclusion may be drawn from the R-I experiments shown in FIG. 15, which shows the R-I curves for the cycles of operation included in FIG. 14. The R-I curves show convergence of the set resistance to a value approaching $10^3 \Omega$ and convergence of the saturated reset resistance to a value slightly below $10^6 \Omega$ after only one operating cycle.

Figure 16:
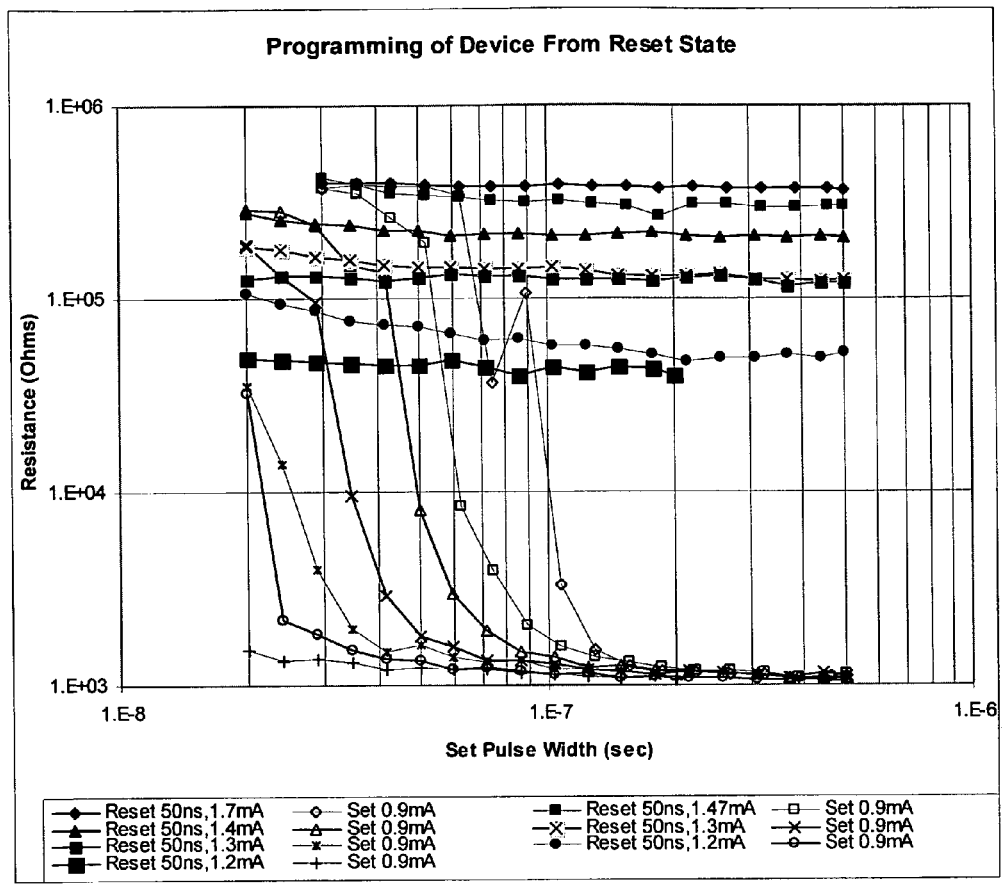
FIG. 16. Set speed characteristics of a dual layer device that includes a 60 Å thick layer of $Ge_{18}Sb_{37}Te_{45}$ and a 750 Å thick layer of $Ge_2Sb_2Te_5$ in the active region of a two-terminal device.

The set speed characteristics of the dual layer device were obtained as described in EXAMPLES 2 and 3 hereinabove and are presented in FIG. 16. FIG. 16 includes a group of generally horizontal reset resistance curves, each with a corresponding generally downward sloping set resistance curve. The conditions used for the reset and set pulses are listed in the legend. The reset pulses had a duration of 50 ns and amplitudes ranging from 1.2 mA to 1.7 mA. The set pulses had an amplitude of 0.9 mA. The principal result of the experiments summarized in FIG. 16 is the observation of a leveling off of the set resistance curves for pulse durations below or slightly above 0.1 μs. Inclusion of an Sb layer in contact with the lower terminal leads to a significant improvement in set speed relative to the control device and did so without compromising the more than two order of magnitude contrast in the resistances of the set and reset states.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:

1. An electronic device comprising
a first terminal;
a second terminal; and
an active region extending from said first terminal to said second terminal, said active region comprising a first layer, said first layer comprising a first chalcogenide material; a second layer in direct contact with said first layer, said second layer comprising a second chalcogenide material; and a third layer, said third layer consisting essentially of Sb;
wherein the composition of said first chalcogenide material differs from the composition of said second chalcogenide material.

2. An electronic device comprising
a first terminal;
a second terminal; and
an active region extending from said first terminal to said second terminal, said active region comprising a first layer, said first layer consisting essentially of Sb, and a second layer, said second layer comprising a chalcogenide material.

3. The electronic device of claim 2, wherein said first layer contacts said first terminal.

4. The electronic device of claim 2, wherein said second layer contacts said first layer.

5. The electronic device of claim 4, wherein said second layer contacts said second terminal.

6. The electronic device of claim 2, wherein said active region further comprises a third layer.

7. The electronic device of claim 6, wherein said third layer comprises Sb.

8. The electronic device of claim 6, wherein said third layer comprises a chalcogenide material.

9. The electronic device of claim 3, wherein said first layer is in direct contact with said first terminal.

10. The electronic device of claim 9, wherein said second layer is in direct contact with said first layer.

11. The electronic device of claim 10, wherein said second layer is in direct contact with said second terminal.

* * * * *